(12) United States Patent
Lee et al.

(10) Patent No.: US 12,093,615 B2
(45) Date of Patent: Sep. 17, 2024

(54) APPARATUS AND METHODS FOR DETERMINING AND SOLVING DESIGN PROBLEMS USING MACHINE LEARNING

(71) Applicant: D.TO, Inc, Wellesley, MA (US)

(72) Inventors: Youngjin Lee, Wellesley, MA (US); Juhun Lee, Wellesley, MA (US)

(73) Assignee: D.TO, Inc.

( * ) Notice: Subject to any disclaimer, the term of this patent is extended or adjusted under 35 U.S.C. 154(b) by 0 days.

(21) Appl. No.: 18/143,281

(22) Filed: May 4, 2023

(65) Prior Publication Data

US 2023/0359790 A1 Nov. 9, 2023

Related U.S. Application Data

(60) Provisional application No. 63/338,652, filed on May 5, 2022.

(51) Int. Cl.
*G06F 30/27* (2020.01)
*G06F 30/13* (2020.01)

(52) U.S. Cl.
CPC .............. *G06F 30/27* (2020.01); *G06F 30/13* (2020.01)

(58) Field of Classification Search
CPC ................................ G06F 30/27; G06F 30/13
See application file for complete search history.

(56) References Cited

U.S. PATENT DOCUMENTS

| | | | | |
|---|---|---|---|---|
| 7,042,468 B2* | 5/2006 | Schwegler, Jr. | ........ | G06F 30/13 700/118 |
| 8,762,877 B2* | 6/2014 | Loberg | ..................... | G06N 5/02 715/764 |
| 10,572,970 B2* | 2/2020 | Sturm | ..................... | H04N 23/45 |
| 10,592,765 B2* | 3/2020 | Fathi | .......................... | G06T 7/55 |
| 11,010,500 B2* | 5/2021 | Gauderis | ................. | G06T 19/20 |
| 11,222,145 B2* | 1/2022 | Vanker | ..................... | G06F 30/13 |
| 11,410,362 B1* | 8/2022 | Soltani | .................... | G06T 9/002 |
| 11,494,973 B2* | 11/2022 | Boyadzhiev | .......... | G01C 21/206 |
| 11,676,344 B2* | 6/2023 | Li | ....................... | G06Q 30/0623 345/419 |
| 2008/0125892 A1* | 5/2008 | Hoguet | .............. | G06Q 30/0641 700/98 |
| 2008/0126021 A1* | 5/2008 | Hoguet | ................... | G06T 19/00 703/1 |
| 2008/0126022 A1* | 5/2008 | Hoguet | ................ | G06F 30/398 703/1 |
| 2008/0208654 A1* | 8/2008 | Nahikian | ........... | G06Q 10/0633 705/7.33 |

(Continued)

*Primary Examiner* — Charles L Beard
(74) *Attorney, Agent, or Firm* — Caldwell Intellectual Property Law

(57) ABSTRACT

An apparatus and method for determining and solving design problems is illustrated herein. Apparatus includes a processor and a database of components by manufacturer. The processor is configured to receive a representative part model which may include 2D prints and 3D models of a building design. The processor is configured to identify and categorize the representative part model to a design problem and generate design solutions to solve the design problem. The processor is also configured to encode layers of required information for a first machine-learning module. The processor determines components from the database of components, as a function of the design solution.

20 Claims, 11 Drawing Sheets

(56) References Cited

U.S. PATENT DOCUMENTS

| | | | | |
|---|---|---|---|---|
| 2009/0138113 | A1* | 5/2009 | Hoguet | G06Q 30/02 700/98 |
| 2009/0160856 | A1* | 6/2009 | Hoguet | G06T 17/00 345/420 |
| 2010/0268513 | A1* | 10/2010 | Loberg | G06F 30/13 703/1 |
| 2011/0061011 | A1* | 3/2011 | Hoguet | G06Q 30/0603 715/769 |
| 2012/0268463 | A1* | 10/2012 | Loberg | G06F 30/13 345/420 |
| 2013/0113797 | A1* | 5/2013 | Mitrakis | G06T 17/10 345/420 |
| 2013/0325763 | A1* | 12/2013 | Cantor | G06Q 10/06312 706/12 |
| 2014/0032179 | A1* | 1/2014 | Solihin | G06F 30/18 703/1 |
| 2014/0046632 | A1* | 2/2014 | Solihin | E04G 21/3204 703/1 |
| 2014/0046884 | A1* | 2/2014 | Erdmann | G06N 20/00 706/20 |
| 2014/0278280 | A1* | 9/2014 | Pardo-Fernandez | G06F 30/13 703/1 |
| 2015/0045928 | A1* | 2/2015 | Perez | B29C 48/05 700/110 |
| 2015/0073845 | A1* | 3/2015 | Bassiri | G06Q 10/0631 705/7.12 |
| 2015/0169791 | A1* | 6/2015 | Lavrov | G06Q 10/103 703/1 |
| 2016/0246813 | A1* | 8/2016 | Nasef | G06F 16/176 |
| 2017/0083822 | A1* | 3/2017 | Adendorff | G06F 11/0793 |
| 2018/0232471 | A1* | 8/2018 | Schissler | G06F 18/2413 |
| 2018/0349780 | A1* | 12/2018 | Xiu | G06N 5/04 |
| 2019/0056715 | A1* | 2/2019 | Subramaniyan | G06N 7/01 |
| 2019/0228115 | A1* | 7/2019 | Bergin | G06F 3/04883 |
| 2019/0243928 | A1* | 8/2019 | Rejeb Sfar | G06V 10/82 |
| 2019/0318048 | A1* | 10/2019 | Kubicki | G06F 30/13 |
| 2019/0385363 | A1* | 12/2019 | Porter | G06F 30/13 |
| 2020/0057824 | A1* | 2/2020 | Yeh | G06F 30/13 |
| 2020/0080744 | A1* | 3/2020 | Sohn | G06N 3/08 |
| 2020/0117336 | A1* | 4/2020 | Mani | F25B 49/005 |
| 2020/0133970 | A1* | 4/2020 | Khabiri | G06N 3/088 |
| 2020/0159197 | A1* | 5/2020 | Horiwaki | G05B 19/41875 |
| 2021/0150088 | A1* | 5/2021 | Gallo | G06V 30/422 |
| 2021/0192111 | A1* | 6/2021 | Hoyer | G06F 30/13 |
| 2021/0264369 | A1* | 8/2021 | Zass | G06F 8/70 |
| 2021/0365602 | A1* | 11/2021 | Gifford | G06T 17/00 |
| 2021/0397142 | A1* | 12/2021 | Lovell | G06F 30/27 |
| 2022/0108043 | A1* | 4/2022 | Yang | G06T 3/153 |
| 2022/0270192 | A1* | 8/2022 | Paz Erez | G06Q 10/0637 |
| 2022/0292230 | A1* | 9/2022 | Murphy | G06F 30/27 |
| 2022/0292240 | A1* | 9/2022 | Murphy | G06F 30/27 |
| 2022/0292421 | A1* | 9/2022 | Murphy | G06V 10/82 |
| 2022/0317639 | A1* | 10/2022 | Karri | G06F 30/13 |
| 2022/0351113 | A1* | 11/2022 | Nishida | G06Q 10/083 |
| 2022/0374802 | A1* | 11/2022 | Morkos | G06F 30/13 |
| 2022/0382924 | A1* | 12/2022 | Marroquin | G06F 30/13 |
| 2022/0391627 | A1* | 12/2022 | Powles | G06Q 10/103 |
| 2022/0404834 | A1* | 12/2022 | Sasaoka | G06Q 50/08 |
| 2023/0095173 | A1* | 3/2023 | Khosravan | G06T 5/73 |
| 2023/0138762 | A1* | 5/2023 | Lambert | G06T 5/50 382/103 |
| 2023/0185978 | A1* | 6/2023 | Danon | G06F 30/12 703/1 |
| 2023/0186117 | A1* | 6/2023 | Durvasula | G06N 3/09 706/12 |
| 2023/0290024 | A1* | 9/2023 | ?Etintas | G06F 30/12 |
| 2024/0012955 | A1* | 1/2024 | Abhinav | G06F 30/13 |
| 2024/0029352 | A1* | 1/2024 | Wan | G06T 7/70 |

* cited by examiner

APPARATUS AND METHODS FOR DETERMINING AND SOLVING DESIGN PROBLEMS USING MACHINE LEARNING

CROSS-REFERENCE TO RELATED APPLICATIONS

This application claims the benefit of priority of U.S. Provisional Patent Application Ser. No. 63/338,652, filed on May 5, 2022, and titled "APPARATUS AND METHODS FOR DETERMINING AND SOLVING DESIGN PROBLEMS USING MACHINE LEARNING" which is incorporated by reference herein in its entirety.

FIELD OF THE INVENTION

The present invention generally relates to the field of architecture design. In particular, the present invention is directed to apparatus and methods for determining and solving design problems using machine learning.

BACKGROUND

The introduction of Building Information Modeling (BIM) enabled 3D modeling with building information embedded. However, BIM did not improve efficiency during the mid-late phases in the architecture design process, such as design development and construction documentation. As a result, designers are still relying on exhaustive searches and manual drafting tasks. The mid-late phases take up more than 60% of the entire project time and cost. There is a need to develop practical software that offers design guidance and a database of design references.

SUMMARY OF THE DISCLOSURE

In an aspect, an apparatus for determining and solving design problems using machine learning includes a database of components from a plurality of manufacturers, at least a processor, and a memory communicatively connected to the processor, the memory containing instructions configuring the at least a processor to receive a representative part model, wherein the representative part model comprises a computer model of a building design, categorize representative part model to a design problem using a first machine-learning module, as a function of the representative part model, generate a design solution using a second machine-learning module, as a function of the design problem, and determine a plurality of components as a function of the database of components and the design solution.

In another aspect, a method for determining and solving design problems using machine learning includes receiving, from a user, a representative part model wherein the representative part model comprises a computer model of a building design, categorizing, by a processor, the representative part model to a design problem as a function of a first machine-learning module and the representative part model, generating, by the processor, a design solution as a function of a second machine-learning module and the design problem, determining, by the processor, a plurality of components as a function of the database of components and the design solution.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

At a high level, aspects of the present disclosure are directed to apparatus and methods that guide a user through the requirements of building assembly design through the use of machine learning. Aspects of the present disclosure may consider complex conditions of various building materials, constructability, or the like to suggest potential design changes to a model.

Aspects of the present disclosure can be used to help complete construction drawings by eliminating any labor-intensive drafting tasks. Exemplary embodiments illustrating aspects of the present disclosure are described below in the context of several specific examples.

Figure 1:
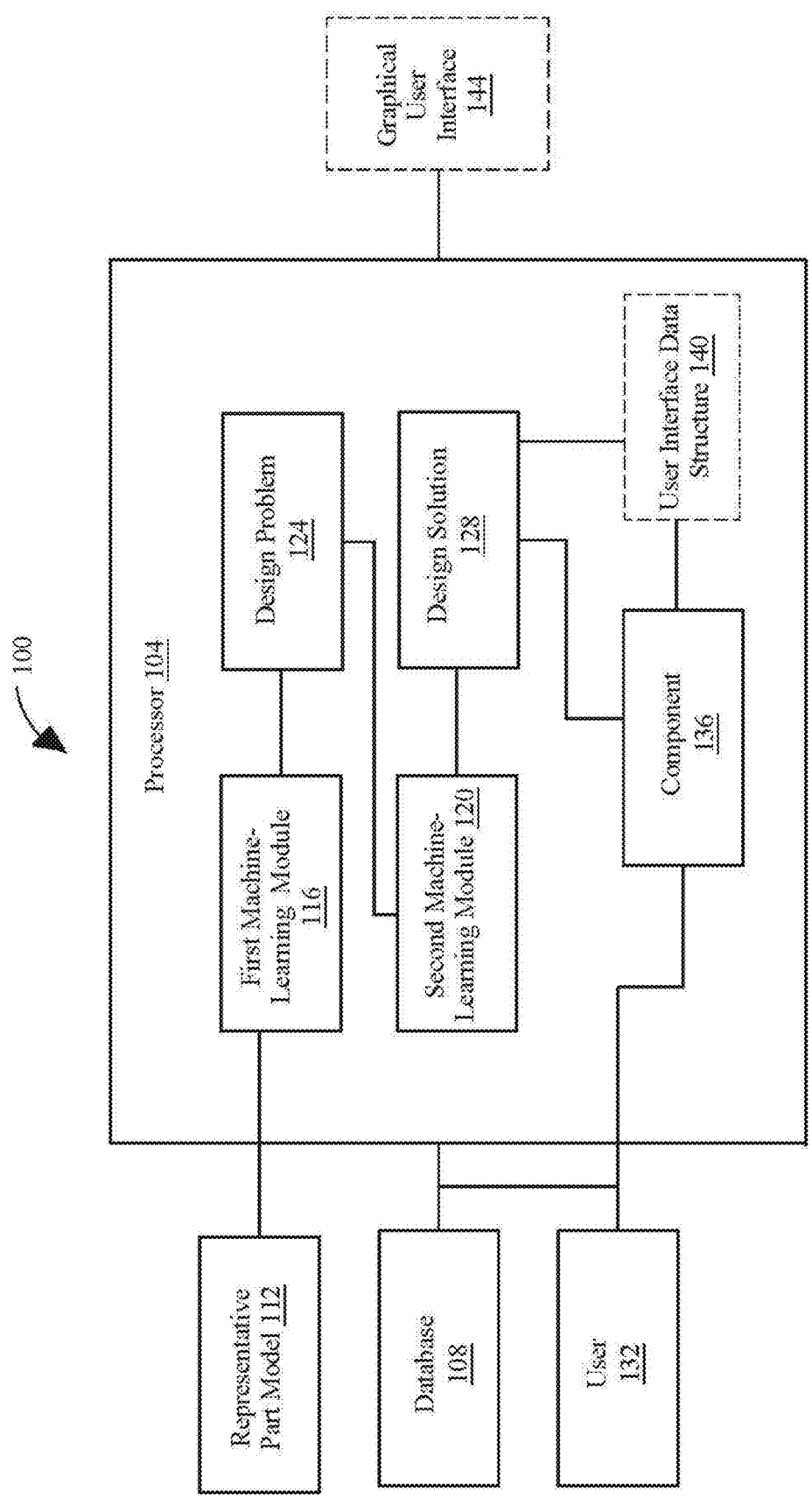
FIG. 1 is an exemplary embodiment of an apparatus for determining and solving design problems using artificial intelligence.

Referring now to FIG. 1, an exemplary embodiment of an apparatus 100 for determining and solving design problems using artificial intelligence is illustrated. Apparatus 100 includes a processor 104. Processor 104 may include any computing device as described in this disclosure, including without limitation a microcontroller, microprocessor, digital signal processor (DSP) and/or system on a chip (SoC) as described in this disclosure. Computing device may include, be included in, and/or communicate with a mobile device such as a mobile telephone or smartphone. Processor 104 may include a single computing device operating independently, or may include two or more computing device operating in concert, in parallel, sequentially or the like; two or more computing devices may be included together in a single computing device or in two or more computing devices. Processor 104 may interface or communicate with one or more additional devices as described below in further detail via a network interface device. Network interface device may be utilized for connecting Processor 104 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Processor 104 may include but is not limited to, for example, a computing device or cluster of computing devices in a first location and a second computing device or cluster of computing devices in a second location. Processor 104 may include one or more computing devices dedicated to data storage, security, distribution of traffic for load balancing, and the like. Processor 104 may distribute one or more computing tasks as described below across a plurality of computing devices of computing device, which may operate in parallel, in series, redundantly, or in any other manner used for distribution of tasks or memory between computing devices. Processor 104 may be implemented using a "shared nothing" architecture in which data is cached at the worker, in an embodiment, this may enable scalability of apparatus 100 and/or computing device.

With continued reference to FIG. 1, processor 104 may be designed and/or configured to perform any method, method step, or sequence of method steps in any embodiment described in this disclosure, in any order and with any degree of repetition. For instance, processor 104 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Processor 104 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Continuing to reference FIG. 1, apparatus 100 includes a database 108 of components from a plurality of manufacturers. Database 108 may be implemented, without limitation, as a relational database, a key-value retrieval database such as a NOSQL database, or any other format or structure for use as a database that a person skilled in the art would recognize as suitable upon review of the entirety of this disclosure. Database 108 may alternatively or additionally be implemented using a distributed data storage protocol and/or data structure, such as a distributed hash table or the like. Database 108 may include a plurality of data entries and/or records as described above. Data entries in a database may be flagged with or linked to one or more additional elements of information, which may be reflected in data entry cells and/or in linked tables such as tables related by one or more indices in a relational database. Persons skilled in the art, upon reviewing the entirety of this disclosure, will be aware of various ways in which data entries in a database may store, retrieve, organize, and/or reflect data and/or records as used herein, as well as categories and/or populations of data consistently with this disclosure. A database of components may include design-based products from a plurality of manufacturers. A database of components may include products and materials relating to the products. Components may include building materials such as aluminum composite metal panels, insulation, I-beams, or the like. Manufactures may opt-in to providing database 108 with components that they provide. Database 108 may also include information on manufactures, such as location, phone number, email, and/or other contact information. Database 108 may store a description of the manufacturer that may be submitted to the database 108 by the manufacturer. Database 108 may be communicatively connected to processor 104. Database 108 may be used by apparatus 100 to suggest products to users of apparatus 100 during a design process. Manufacturers may use add their products and/or components into database 108 as a way to market to users that may use the building components.

Continuing to reference FIG. 1, processor 104 is configured to receive a representative part model 112. Representative part model 112 may be delivered through a user device, such as a smartphone, tablet, laptop, or the like. Representative part model 112 further includes a plurality of sides. A "representative part model," as used in this disclosure, is a computer model of a part to be manufactured, wherein manufacturing may include any manufacturing process as described in the entirety of this disclosure. The part may include any item made of materials such as metals including, for example, aluminum and steel alloys, brass, and the like, plastics, such as nylon, acrylic, ABS, Delrin, polycarbonate, and the like, foam, composites, wood, etc. Representative part model 112 may further include any data describing and/or relating to a computer model of a part to be manufactured. In some cases, representative part model may contain data in the form of an STL file, an OBJ FILE, an FBX file and any other file suitable for representative part models. In some cases, representative part model 112 may contain data in any form suitable for use in other design software such as, and without limitation, Revit, ArchiCAD, Rhino, AutoCAD, and/or any other applicable design software. A computer model, as described herein, is a digital model of a physical structure as created using building information modeling (BIM). BIM models may cover spatial relationships, geospatial information, quantities and properties of building components (for example, manufacturers' details), and enables a wide range of collaborative processes relating to the built asset from initial planning through to construction and then throughout its operational life. BIM models for the purposes of this disclosure may include any models and/or objects that may be generated and/or created using any design software. For example, a BIM model may include a model created by a design software such as AutoCAD.

Still referring to FIG. 1, representative part model 112 may include a plurality of sides. Each side of plurality of sides, as used in this disclosure, may include a view of representative part model 112 from a plane orthogonal to an axis passing through an origin of representative part model 112. The axis may include, as a non-limiting example, a three-axis coordinate system, such as the x-axis, y-axis, and z-axis, or abscissa, ordinate, and applicate. The axis may include, as a further non-limiting example, any axis passing through an origin of the representative part model. Persons skilled in the art, upon reviewing the entirety of this disclosure, will be aware of axis which may be suitable for use as each side of the plurality of sides consistently with this disclosure. The origin of the representative part model, as described herein, is a fixed point of reference for the representative part model 108. For example and without limitation, the origin may include the center of mass, the geometric center, the center of a feature of the part, wherein a feature may be a hole, a well, a groove, a pocket, a channel, extruded volume, and the like. As a further example and without limitation, the origin may include any position of the representative part model. In some embodiments, the representative part model 112 may include physical example of the part to manufactured.

Continuing to refer to FIG. 1, representative part model 112 may include a print which may further include semantic information of the part to be built. A "print" as used herein, is a two-dimensional drawing of a representative part model 112. As used in this disclosure, "two-dimensional" means having, appearing to have, or displaying two out of the three dimensions. Print may be a section of the representative part model. In an embodiment, print may be a portion of a wall of a building. Print may include semantic information of the representative part model 112. Semantic information may include measurements of different walls and building components. Semantic information may include information on different materials of the components of the print. Semantic information may include tolerancing and dimensioning of various components of the print.

With continued reference to FIG. 1, representative part model 112 may be received through user input, such and without limitations, by a user inputting or uploading representative part model into a computing device. In some cases, apparatus 100 may include an "add-on" software configured to be added to another software program. An "add-on" for the purposes of this disclosure is a feature allowing a device or a software to be added to an already existing device or software. The add-on may provide for enhanced features and/or added features. Apparatus 100 may be configured as an add-on for an existing design program wherein a user may interact with apparatus without having to leave the current software program. As a non-limiting example, apparatus 100 may be configured as an add on for a design software such as solid works, wherein user may interact with apparatus 100 within Solid works. The user may receive design guidance problems and solutions within Solid works. Apparatus 100 may receive the representative part model in a format similar to the format that the model is being generated within the design software. Apparatus 100 may further provide design solutions, components 136 and the like in a similar format as the representative part model 112 was received. In some cases, processor 104 may receive representative model through an add-on feature of another program. For example, processor 104 may automatically receive representative part model 112 based on a user's interaction with the software. A user may be building or designing a part wherein processor may automatically detect the presence of a part wherein processor may receive the part. In some cases, user may interact with a feature within the software program to submit the part to processor.

With continued reference to FIG. 1, apparatus 100 may further be configured to retrieve any other relevant data such as, and without limitation, View Type, Geometry Configuration, Building Assembly Types, Building Assembly Layers, and the like from user's design models/drawings to identify their design problem. In some cases apparatus 100 may be configured to classify or categorize data using the original format that the representative part model 112 was received in. For example, processor 104 may receive representative part model in a STEP format wherein processor 104 may perform calculation and determinations on the file and produce a similar file.

With continued reference to FIG. 1, representative part model 112 may be classified to a design class. A "design class" for the purposes of this disclosure is a grouping of representative part model 112 based on particular design parameter. Design class may include classes such as, and without limitation, construction types, climate zones, use and occupancy types of the like. In some cases representative part model 112 may be classified to one or more design classes such a particular construction type, a particular climate zone and the like. In some cases, representative part model may include data indicating a particular class it belongs to wherein processor 104 may label representative part model 112 with the appropriate class. In some cases classifying representative part model 112 may include using a classifier machine learning model. Using the classifier machine learning model may include receiving training data. Training data may include a plurality of representative part models correlated to a plurality of design classes. In an embodiment, training data may indicate that a particular representative part model 112 may be associated with a particular class. In some cases, training data may be received from a user, a third party, database, external computing devices, previous iterations of the function and/or the like. In some embodiments, training data may be stored in a database. In some embodiments, training data may be retrieved from a database. In some embodiments, representative part model 112 and the correlated design class may be stored in a database and used as training data for future iterations. Similarly, training data may be created from previous iterations wherein a previous representative part model 112 and correlated design class was received and stored on a database. Classifying representative part model 112 may further include training a machine learning model as a function of the training data and classifying representative part model 112 as a function of the machine learning model. In some embodiments, outputs of the machine learning model may be used to train the training data.

Still referencing FIG. 1, processor 104 is configured to categorize representative part model 112 to design problem 124 using a first machine-learning module 116. First machine-learning module 116 may be a classifier, as discussed below. In some cases, design problem 124 may be an individual label within a grouping of labels wherein representative part model 112 is classified and/or categorized to a particular design problem. In some cases, representative part model 112 may be classified to a particular class and/or category wherein the classification of a particular class may indicate a particular design problem 124. For example, representative part model 112 may be categorized and/or classified to a particular design problem 124 that may indicate that representative part model 112 requires a particular solution. In some cases, representative part model 112 may be categorized to more than one design problems wherein each design problem 124 may indicate a particular issue that requires an associated solution. In some cases representative part model 112 may be categorized using a classifier. A design problem 124 may be areas in the model 112 that needs more details and refinement. Design problem 124 may also include determining physical properties of various materials. A design problem 124 may further include structural issues, weak points, points that may be prone to damage, points that may be prone to bending and the like. In some cases, design problem 124 may include structural weak points of a part, wherein the manufacturing of said part may result in a product prone to damage. In some cases, design problem 124 may include the maximum loads, stress, tensile strength, and the like for a particular part. This information may be used to determine the current strength of a particular part and compare it to regulations within a given geographic area. For example, design problem 124 may indicate that a particular model contains a maximum strength that is less than the required strength for such a model with respect to governmental regulations. Another design problem 124 may include designing to a manufacturer's standards. In an embodiment, design problems arise after the initial design of a building, during design development and construction documentation phases. During these phases, the representative part model 112 may be transformed from a basic design to include details such as a structural system, heating and cooling systems, lighting systems, written specifications covering all materials used in the building, methods of construction, or the like. In an embodiment, first machine-learning module 116 may identify a potential problem in representative part model 112 during a building assembly design process that needs to be resolved to complete the design. For example, first machine-learning module 116 may identify various lines as different building components such as a wall or a window or brick veneer. First-machine learning module 116 may be supervised and may be trained with training data. Training data may include a database of prints of representative part models and their corresponding building components. For example, training data may include a hatch pattern that is associated with various materials, such as a cross hatch that is associated with alloys. In an embodiment, first machine-learning module 116 may identify a print of a section of the representative part model 112 as brick veneer with concrete masonry unit wall back up. In another embodiment, first machine-learning module 116 may identify a print of the representative part model 112 as a rainscreen with cold-formed metal framing backup wall-to-soffit design. In some cases, training data may include a plurality of representative part models correlated to a plurality of design problems. In an embodiment, a particular representative part model may indicate a particular design problem. In some cases, a particular representative part model may be categorized to a particular design problem.

Continuing to reference FIG. 1, processor 104 is configured to generate a design solution 128 using a second machine-learning module 120, as a function of the design problem 124. Design solution 128 may include design guidance drawings based on design problem 124 that help complete the overall representative part model 112. Design solution 128 may be presented in a visual format, such as a visual drawing, or the like. For example, second machine-learning module 120 may identify a need for a necessary air vapor barrier when using continuous thermal insulation. Second machine-learning module 120 may also identify that the air vapor barrier may need sheathing to support it and ventilation holes so ventilate it. In some cases, second machine learning module 120 may identify that a particular component within representative part model 112 may need to be required of a particular material. This requirement may be due to structural issues, environmental issues, safety issues and the like. In some cases, second machine learning module 120 may identify that a particular component may need to be resized due to structural, environmental and/or safety issues. In some cases, design solution 128 may contain more than one solution to help complete the overall representative model 112. In some cases, an individual solution within design solution 128 may be associated with an individual design problem 124. Design problem 124 may contain more than one problem wherein design solution 128 contains multiple solutions wherein each solution within design solution 128 is associated with each problem within design problem 124. For example, a particular problem within design problem 124 may have a corresponding solution within design solution 128. In an embodiment, a user 132 may be guided through these design choices. Machine-learning module 120 may be supervised. Second machine-learning module 120 may be trained using training data. Training data may include previously identified design problems on representative part models. In some cases, training data may further include a plurality of design problems correlated to a plurality of design solutions. In an embodiment, a particular design problem may be correlated to a particular solution. Training data may be user inputted such that a user 132 may input categorized representative part model 112 and output key design points based on the categorized representative part model 112. For example, training data may include an input of a print of the representative part model 112 that includes a rainscreen with cold-formed metal framing backup wall-to-soffit design. Training data may include an output that includes key design points for the rainscreen that includes an air vapor barrier (AVB), AVB-substrate, flashing, and weep hole. Second machine-learning module 120 may include a generative adversarial network (GAN) which may process training data. As used herein, a "generative adversarial network" is an unsupervised learning task in machine learning that involves automatically discovering and learning the regularities or patterns in input data in such a way that the model can be used to generate or output new examples that plausibly could have been drawn from the original dataset. In some cases, training data may be generated, by a user, $3^{rd}$ party or the like. In some cases, training data may be generated based on previous iterations of the processing.

With continued reference to FIG. 1, any training data described in this disclosure may be generated by a $3^{rd}$ party such as a consulting firm, a $3^{rd}$ party, a profession in the design and/or building fields and the like. In some cases, apparatus 100 may include a plurality of training data wherein each user and/or $3^{rd}$ party may create their own training data. For example, a particular consulting firm may generate their own training data comprising a plurality of inputs correlated to a plurality of outputs, wherein training data may indicate a particular output or a particular design solution 128. In some cases, differing training data may provide different outputs such as differing visual designs, differing components (e.g. such as those provided only by the consulting firm) and the like. In some cases, a user 132 may select from a plurality of training data to be used for computing wherein each training data may provide for a particular solution, problem, component and the like. In some cases, consulting firms and/or 3$^{rd}$ parties may provide their own outputs wherein users 132 may interact with the consulting firms and reach out for feedback and advice. In some cases the plurality of training data may be used to set particular requirements amongst a company or an entity. For example, a specific company or business may have particular design problem 124 and/or design solution 128 that may need to be addressed whereas another entity may not. Training data may differ wherein each set of training data may contain a focus on a differing particular area. In some cases a particular entity may have requirements for completing and/or detailing a particular set of models whereas another entity may not.

Continuing to reference FIG. 1, processor 104 may help complete representative part model 112 using the design solution 128. In an embodiment, processor 104 may use BIM integrated objects that represent key design points that may need to be added to the model 112. In an embodiment, BIM integrated objects may include various lines that represent different building components. For example, a user 132 may be able to click and drop an air vapor barrier that is represented by dotted lines of different lengths on to the representative part model 112. BIM integrated objects may be presented as a list to user 132 that may click and drop selected objects directly onto the model 112. A user 132 may select to add an air vapor barrier because of the design guidance and/or design solution 128 provided by the machine learning modules discussed above. This click and drop feature may save time and labor during the design development and construction documentation phases of the design process. In some cases, processor 104 may produce at least one BIM integrated object as a function of the different building components wherein each BIM integrated object is a visual representation of a component such as key lines and the like. In some cases, producing the BIM object includes receiving a BIM object associated with the component. In some cases, a user may select a particular component wherein selection of a particular component may result in the production of the BIM integrated object by processor 104. In some cases, processor 104 may provide a plurality of BIM integrated objects that are each correlated to the components. User 132 may view differing BIM integrated objects that are correlated to components with different manufacturers. In some cases, 3$^{rd}$ parties may upload a plurality of BIM integrated objects that are associated with components wherein processor may use the plurality of BIM integrated objects to provide to a user. In some cases, BIM integrated objects may be received from a third party. In some cases, BIM integrated objects may be received by a 3$^{rd}$ party and validated by an operator to ensure its accuracy.

Continuing to reference FIG. 1, processor 104 may recommend building components 136 from database 108 of components based on design solution 128 and the design problem 124. In an embodiment, the first machine-learning module 116 may recognize specific materials on the model 112 and the second machine-learning module 120 may recognize specific components 136 needed for model 112. Processor 104 may pull components 136 from database 108 that relate to the model 112. In an embodiment, processor 104 may tailor specific products from various manufacturers for a user 132 to consider and/or select for their design project. For example, using the various machine-learning modules, processor 104 may recognize that user 132 is designing a wall to soffit detail with metal panels. Processor 104 may recommend an ALUCOBOND® panel provided by ALUCOBOND®, of Benton Kentucky, to be used as a material choice for a metal panel. In selecting a specific material from a manufacturer, processor 104 may also provide BIM integrated objects associated with the specific material to be added to the model 112. For example, processor 104 may recommend an addition of an ALUCOBOND® Clip-Double if the user 132 were to use an ALUCOBOND® metal panel. In some cases, determining the plurality of components may include determining as a function of classifying representative part model 112 to a design class. Components 136 may be categorized to design classes wherein processor 104 may select on those components 136 that pertain to a similar class as representative part model 112.

With continued reference to FIG. 1, processor 104 may be configured to create a user interface data structure 140. As used in this disclosure, "user interface data structure" is a data structure representing a specialized formatting of data on a computer configured such that the information can be effectively presented for a user interface. User interface data structure 140 may include the plurality of components. In some cases user interface data structure 140 may further include the design solution 128. In some cases, user interface data structure 140 further includes any data as described in this disclosure. Processor 104 may be configured to generate user interface data structure 140 using any combination of data as described in this disclosure.

With continued reference to FIG. 1, processor 104 may further be configured to transmit the user interface data structure 140. Transmitting may include, and without limitation, transmitting using a wired or wireless connection, direct, or indirect, and between two or more components, circuits, devices, systems, and the like, which allows for reception and/or transmittance of data and/or signal(s) therebetween. Data and/or signals therebetween may include, without limitation, electrical, electromagnetic, magnetic, video, audio, radio, and microwave data and/or signals, combinations thereof, and the like, among others. Processor 104 may transmit the data described above to a database wherein the data may be accessed from a database, processor 104 may further transmit the data above to a device display or another computing device.

With continued reference to FIG. 1, apparatus 100 may include a graphical user interface 144 (GUI). Additionally or alternatively, processor 104 may be configured to transmit the user interface data structure 140 to a GUI 144. For the purposes of this disclosure, a "user interface" is a means by which a user and a computer system interact; for example, through the use of input devices and software. A user interface may include graphical user interface, command line interface (CLI), menu-driven user interface, touch user interface, voice user interface (VUI), form-based user interface, any combination thereof and the like. In some embodiments, a user may interact with the user interface using a Computing device and/or a processor distinct from and communicatively connected to processor. For example, a smart phone, smart tablet, or laptop operated by the user. A user interface may include one or more graphical locator and/or cursor facilities allowing a user to interact with graphical models and/or combinations thereof, for instance using a touchscreen, touchpad, mouse, keyboard, and/or other manual data entry devices. A "graphical user interface," as used herein, is a user interface that allows users to interact with electronic devices through visual representations on the devices. In some cases, GUI 144 may be communicatively connected to processor 104 and configured to receive user interface data structure 140. Additionally or alternatively, GUI 144 may be configured to display the plurality of components as a function of the user interface data structure 140. In some embodiments, GUI 144 may include icons, menus, other visual indicators, or representations (graphics), audio indicators such as primary notation, and display information and related user controls. A menu may contain a list of choices and may allow users to select one from them. A menu bar may be displayed horizontally across the screen such as pull-down menu. When any option is clicked in this menu, then the pull-down menu may appear. A menu may include a context menu that appears only when the user performs a specific action. An example of this is pressing the right mouse button. When this is done, a menu may appear under the cursor. Files, programs, web pages and the like may be represented using a small picture in a graphical user interface. Persons skilled in the art, upon reviewing the entirety of this disclosure, will be aware of various ways in which a graphical user interface and/or elements thereof may be implemented and/or used as described in this disclosure.

With continued reference to FIG. 1, GUI 144 may display data to user 132 such that user 132 may view the data generated and interact with the data. User may view the design solution 128 in a visual format such as a visual drawing wherein a user may view the visual drawing and make any corresponding changes. In some cases, design solution 128 may contain more than one design solution 128 wherein each design solution 128 may contain its own individual visual drawing. User 132 may interact with GUI 144 to scroll through the given design solutions 128 and select the one that may be most appropriate. Similarly, a user may interact with GUI 144 and select one or more components from the plurality of components. In some cases, more than one components 136 may be associated with a particular model wherein a user may select the appropriate components from a list. GUI 144 may be consistent with the user interfaces depicted within FIGS. 2-4 below.

With continued reference to FIG. 1, processor 104 may be configured to generate a modified part model as a function of determining the plurality of components 136. Processor 104 may generate a modified part model having at least one component of the plurality of components 136. For example, processor 104 may add a single clip to representative part model 112 wherein the clip is a component within the plurality of components 136. In some cases, processor 104 may complete representative part model 112 by using BIM integrated objects that represent key points that may need to be added to the model. In some cases, user 132 may interact with GUI 144 and drag and drop BIM integrated objects onto representative part model 112 to create modified part model. BIM integrated objects may be presented as a list to user 132, wherein a user 132 may interact with GUI 144 and click and drop selected objects directly onto the model 112. GUI 144 may be configured to display multiple BIM integrated objects wherein a user 132 may, for example, select to add an air vapor barrier because of the design GUI 144 dance and/or design solution 128 provided by the machine learning modules discussed above. This click and drop feature may save time and labor during the design development and construction documentation phases of the design process. In some cases, generating modified part model includes generating modified part model as a function of user input. User input may include any interaction between user 132 and GUI 144 and/or processor. For example, the click and drop of an integrated object may constitute a user input. In some cases, GUI 144 may display a plurality of components for a user to select from wherein selection of the plurality of components.

With continued reference to FIG. 1, apparatus 100 and/or GUI 144 may provide a user with information regarding each design solution. For example, a particular design solution may contain corresponding definitions, examples, and reading material in order to educate a user on the particular design solution and how it may be necessary. In some cases, a user may 'hover' over each design solution 128 wherein processor 104 may display the corresponding information associated with each design solution 128. In some cases, GUI 144 may display plurality of components 136 wherein a user may view each component 136 and view the corresponding information associated with the component such as material, educational information describing the component and its use, and the like. In some cases, a user may 'hover' over a particular component 136 displayed in order to view the corresponding information associated with component 136. In some cases, a user may 'select' or view each component 136 in order to determine if the component was properly selected by processor 104 and/or if the component 136 properly relates to the representative part model. In some cases, information associated with component 136 may include information such as the particular design solution 128 associated with component 136. For example, processor 104 may display information to user 132 on why a particular component was selected such as what design problem was addressed and what design solution was addressed as well. In some cases a user may select, through the GUI 144, a particular component 136 selection of the component may allow a user to view various details associated the component such as the manufacturer involved, its ease of use, its ease of installation, its sustainability, and any other relevant information that may be necessary for selection of a component.

With continued reference to FIG. 1, plurality of components 136 may be determined as a function of user input. "User input" for the purposes of this disclosure is any interaction between a user and a computing device wherein the interaction conveys information to the computing device. For example, selecting a checkbox based on user input may signify to processor 104 that a box was checked wherein processor 104 may execute a function associated with the checkbox. In some cases, processor 104 may provide a user 132 with a plurality of components 136 to choose from. User 132 may input parameters in order to narrow down the components 136 to components that may be specific to the user's 132 needs. For example, user 132 may interact with GUI 144 wherein user 132 may filter through the determined components by signifying to computing device that only particular components should be showed, such as for example, components that focus on sustainability or affordability. In some cases, user 132 may narrow down results by inputting constraints such as, but not limited to, constraints with respect to sustainability, affordability, availability of the component, ease of maintenance, user ratings, ease of installation and the like. In some cases, components 136 may be rated wherein a user 132 may interact with GUI 144 in order to prioritize various components 136 over others. For example, a user 132 may input a command into computing device to signify that components 136 that are the most affordable should be prioritized. In some cases, each constraint described above may contain preference weights wherein each constraint may contain a weight that signifies to computing device to sort components 136 based on a particular weight of each component 136. In some cases, apparatus 100 may utilize a multi-objective optimization wherein a user may select multiple objectives and/or constraints that may output a corresponding component most closely associated with the constraints. For example, a user may desire to search for a component that maxims affordability, and sustainability while ignoring ease of installation. In another nonlimiting example, a user may select one or more constraints to be maximized while minimizing one or more other constraints. GUI may display the components in a descending order wherein the first component may have the highest degree of match with respect to the selected constraints. In some cases components may be displayed in a list, wherein user 132 may scroll, using a computing device and/or a remote device, through the list in order to view components. In some cases, the order of the list may be determined based on user input wherein a user may input a particular priority of components being displayed. In some cases, design solution 128 may be displayed in visual format on representative part model, wherein a user may interact with a computing device and select each design solution 128 on representative part model 112 in order to view the information corresponding to the design solution 128 and the corresponding components 136 that would aid in the design solution. In some cases, a user may compare GUI 144 to display several components to a user, wherein user 132 may select the component that may be most applicable. Each component 136 may include data relating to the constraints that the user has entered as described above. In some cases, components 136 may contain data indicating the degree of match to a particular constraint. For example, a component that is highly affordable may contain a higher degree of match with respect to an 'affordability' constraint whereas a product that is not so affordable may contain a lower degree of match with respect to an affordability constraint. In some cases, GUI 144 may display components 136 based on a degree of match and provide them in descending order wherein a first component may contain a higher degree of match than a second component. In some cases, GUI 144 may display the degrees of match to a user, wherein a user may visualize the degrees of match associated with each constraint. For example, a component may contain a higher degree of match with respect to affordability but a lower degree of match with respect to 'sustainability'. User 132 may view the degrees of match to select the component that best satisfies the user's need.

With continued reference to FIG. 1, apparatus and/or GUI 144 may include a collaboration feature. A "collaboration feature" for the purposes of this disclosure is device and/or a computer program capable of allowing multiple users to view similar information and any corresponding changes made to the information without the having to share the information through another program such as an email service. Collaboration feature may allow for multiple users to view a similar part wherein each user may view the design problems 124 and design solutions associated with the part. In some cases, a user may seek to share part with a manufacturer wherein user and the manufacturer may view the same part in real time and make any corresponding changes. In some cases, multiple users may view a single part wherein each user may make changes to the part. In some cases, collaboration feature may include comment boxes wherein users may post comments associated with representative part model 112 and/or any other data displayed wherein other users may view the comments and make any corresponding actions. In some cases, apparatus may provide a weblink for user 132 to use in order to view a particular representative part model as a part of collaboration feature. In some cases, the weblink may direct a user to a database wherein users may view representative part model through remote device connected to database. In some cases collaboration feature may allow users to share various parts with manufacturers and/or consultants in order to receive feedback on the part that is sought to be created.

With continued reference to FIG. 1, apparatus 100 may further be configured to classify elements of representative part model 112 into region classes. A "region class" for the purposes of this disclosure is a grouping of segments, elements and/or components of a particular model. For example, a region class may include walls, roofs, doors and/or any other components used in construction. In some cases, region classes may include any components that may be added to a large part, such as and without limitations, doors, walls, heating systems, cooling systems and the like. In some cases, processor 104 may classify elements of representative part model 112 to a region class in order to determine the particular elements within the representative part model 112. For example, classification may include determining that a door, or a black exterior wall region exists. Processor 104 may classify elements of representative part model to at least one region class, wherein each class labeling may be determinative that a particular element exists. For example, a label indicating that an element is classified to a door class may be determinative that a door is located within representative part model 112. In some cases, each classification may be indicative that a particular element exists. For example, multiple labels associated with multiple region classes may be indicative that particular elements exists within representative part model 112. In some cases, processor 104 may classify elements of representative part model 112 such that a user may be able to determine what physical parts are needed for the manufacturing and/or building of representative part model 112. In some cases, processor 104 may identify elements within representative part model 112 by classifying elements within representative part model and provide visual description to a user of each classified element. In some cases, each classified element may contain information such as where to purchase, the part, similar parts and the like. In some cases, representative part model 112 may be segmented as a function of the classification. "Segment" for the purposes of this disclosure" is a portion of a larger piece or the process thereof. A segment may include a classified element within representative part model 112. In some cases, processor 104 may provide data on each segment such as parts that may be purchased, sizing, and any other information. In some cases, GUI 144 may be configured to display visual element corresponding to each classified element wherein a user may view each visual element. In some cases, GUI 144 may allow for a user to select a particular region of representative part model 112 that is displayed in order for a user to search through and select similar physical parts corresponding to classified elements within representative part model 112. In some cases, user 132 may select a physical part corresponding to a classified element in representative part model 112 wherein processor 104 may generate an updated representative part model as a function of the selection. For example, selection of a particular physical product may create an updated representative part model having the design or features of the product. In some cases, user 132 may select a particular physical product associated with a classified element or segment based on user's needs. This may include needs based on aesthetics, performance and the like. In some cases, processor 104 may provide similar physical parts that are associated with the classified element. In some cases, processor 104 may be configured to segment representative part model into elements using a machine learning model and/or any computing algorithm as described in this disclosure.

With continued reference to FIG. 1, processor 104 may further be configured to generate a product information sheet as a function of representative part model 112, design, problem 124, design solution 128, components 136 and any other data described within this disclosure. A product information sheet is data describing representative part model and any additional parts that may have been added or altered as a result of the computing. Product information sheet may contain information such as materials used, dimensions, manufacturing time, owner of the part, entity associated with the owner of the part, manufacturers involved, and any other relevant information.

Figure 2:
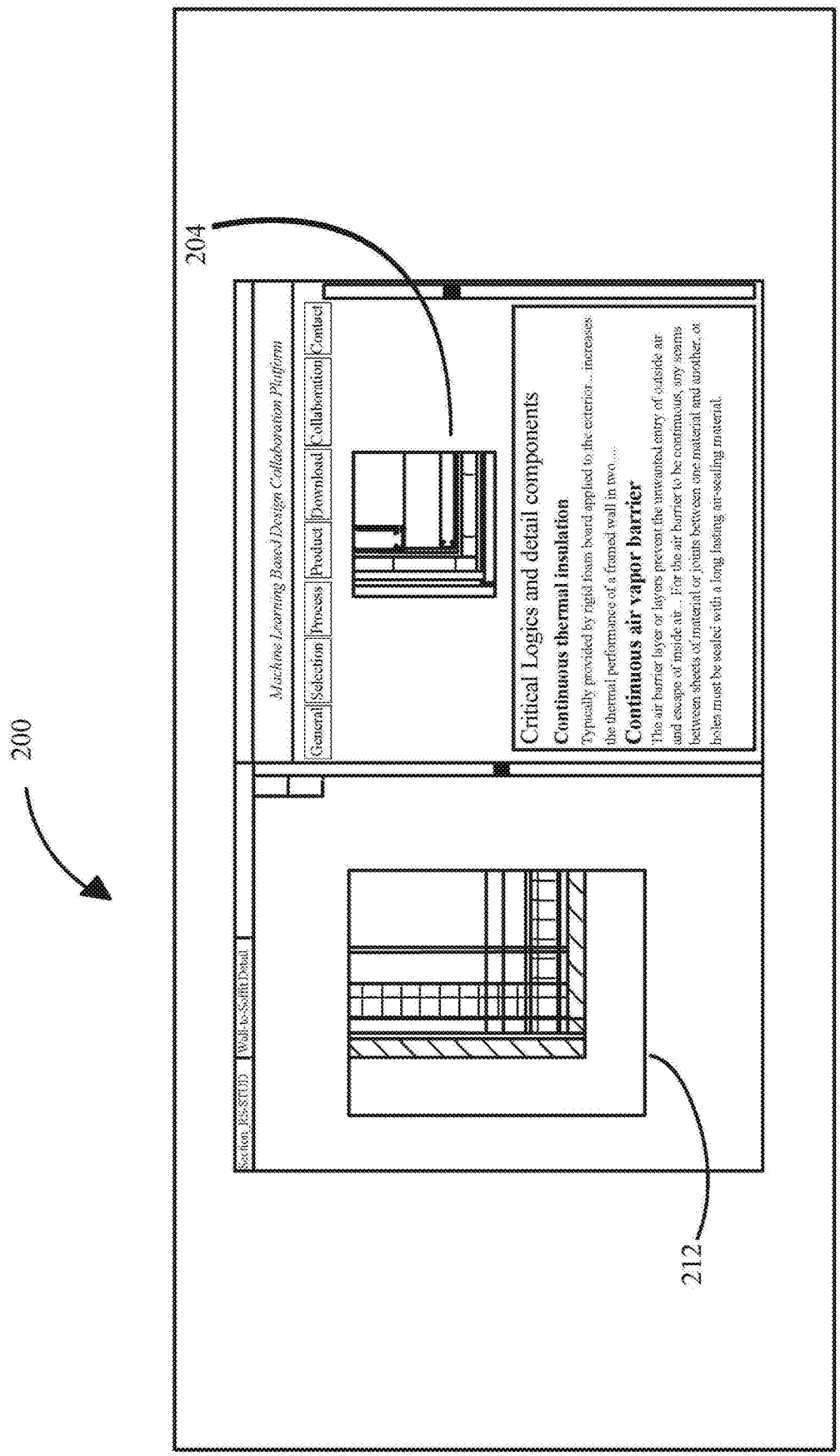
FIG. 2 is an illustration of an exemplary embodiment of a generated solution as a function of a design problem.

Now referencing FIG. 2, a screenshot 200 of an exemplary embodiment of a generated solution as a function of a design problem as described in this disclosure is shown. Model 112 is shown on the left as a section of a print. Model 112 may be converted into a GAN-generated drawing 204, shown on the right, to provide better visualization of a geometric configuration of the design area. GAN-generated drawing may be used by processor 104 to categorize model 112 to design problems. Model 112 is categorized into a design problem and design solutions are generated as a result. Processor 104 may suggest possible design solutions to complete building design.

Figure 3:
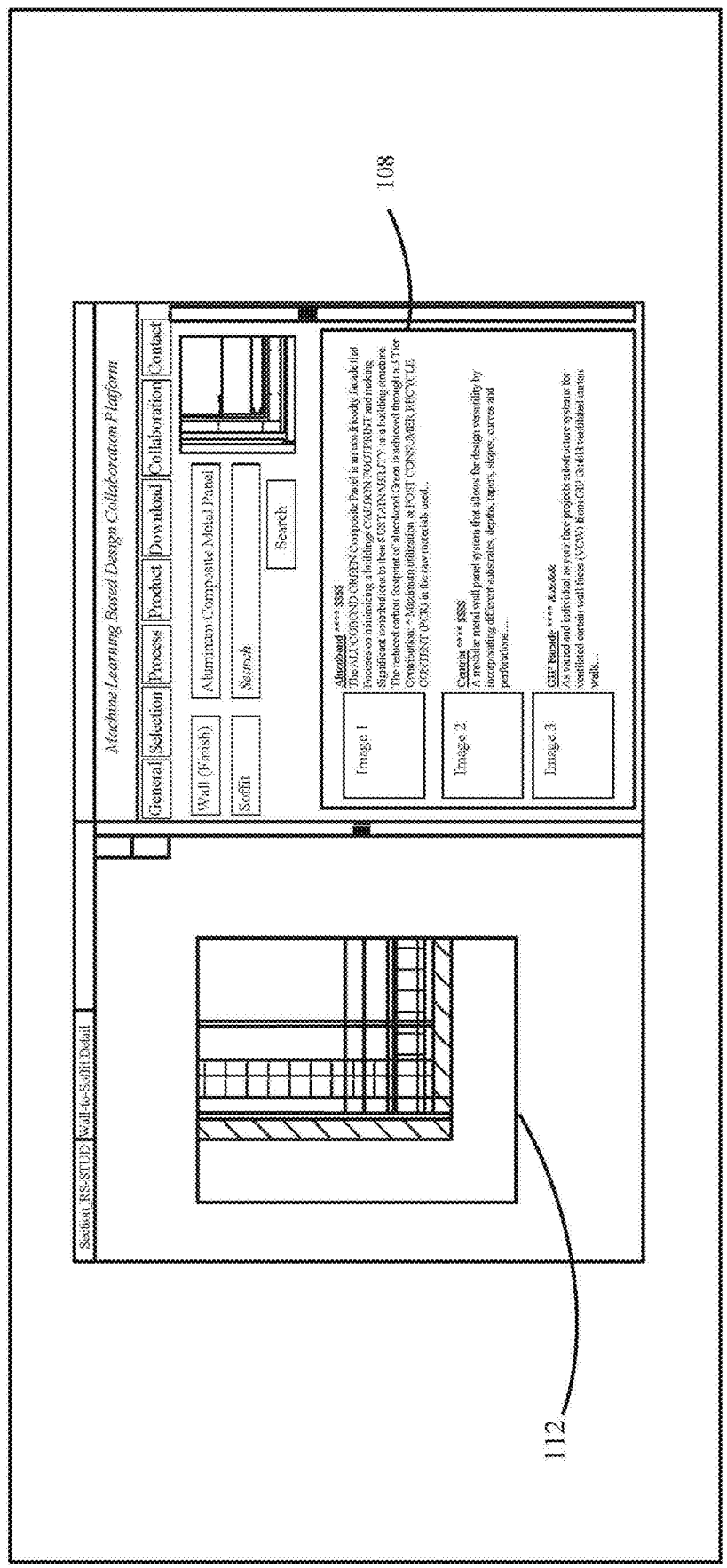
FIG. 3 is an illustration of an exemplary embodiment of a database of components used to select components for a model.

Now referring to FIG. 3, a screenshot 300 of an exemplary embodiment of a database of components 136 used to select components for representative part model 112 is illustrated. In an embodiment, a user may be displayed a list of recommended components from various manufacturers that may be stored in database 108. User may be able to browse all components in database 108. Alternatively or additionally, a user may be shown components of database 108 that pertains to materials needed for model 112 or materials needed for a design solution or components based on categorized model 112 to design problems.

Figure 4:
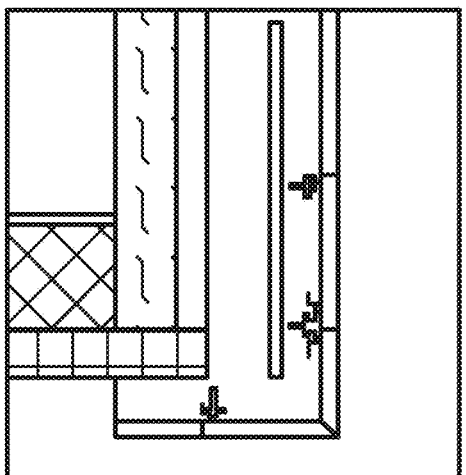
FIG. 4 is an illustration of an exemplary embodiment of a click and drop feature.

Now referring to FIG. 4, a screenshot 400 of an exemplary embodiment of a click and drop feature of apparatus 100. Click and drag feature may be used to add BIM components onto model 112. Processor 104 may suggest BIM components to be added as a function of the design solution and components selected out of database 108. A user may click and drop a BIM component into any desired spot on model 112. BIM components may be used to designate build features such as air vapor barriers, rigid insulation, studs, or the like. Adding the BIM components into model 112 may be a finishing step to making a complete construction drawing.

Figure 5:
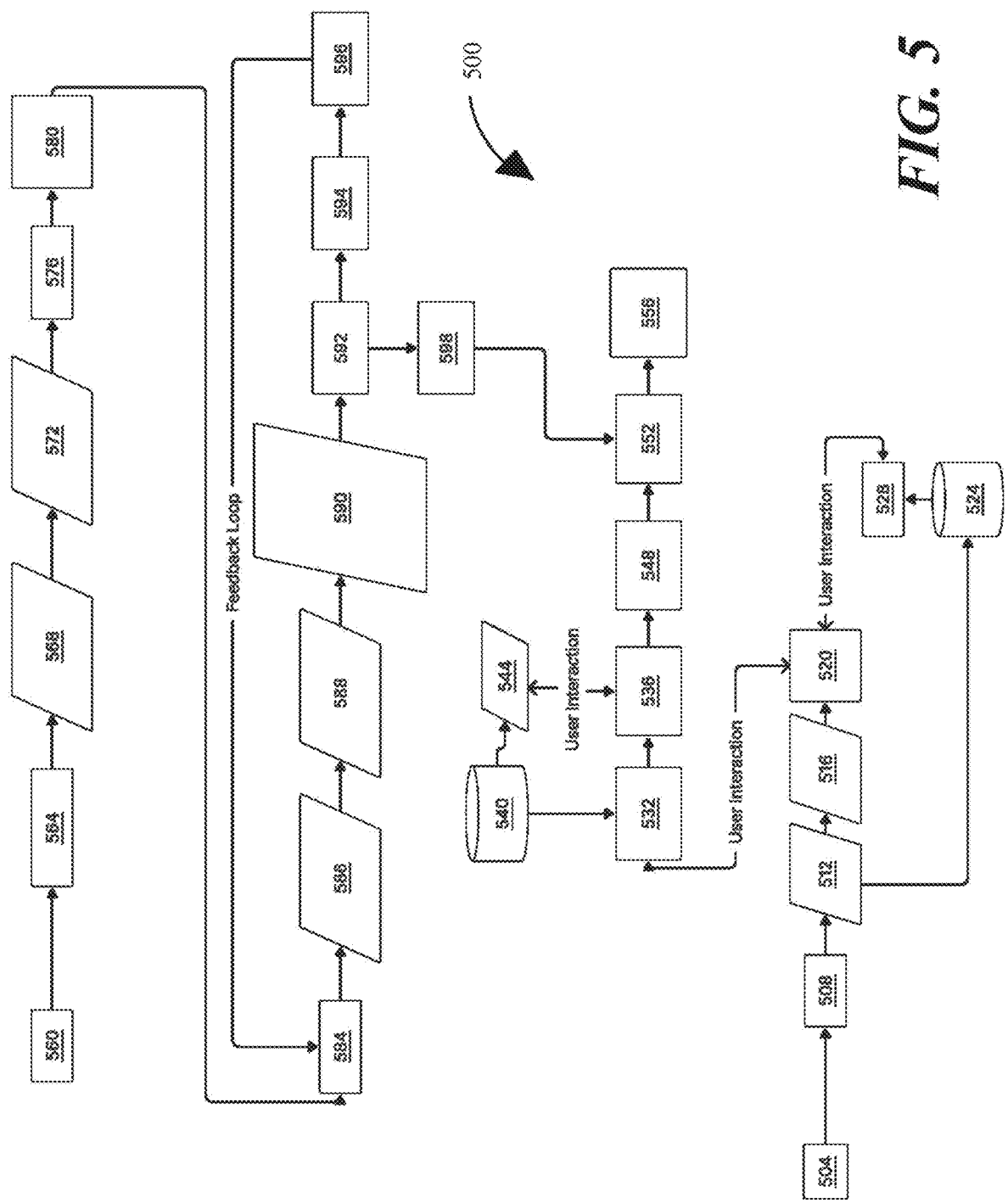
FIG. 5 is a flow diagram illustrating an exemplary embodiment of the apparatus according to the subject disclosure.

Referring now to FIG. 5, A flow diagram of an exemplary embodiment of an apparatus 500 for determining and solving design problems using machine learning is described. At step 504, user may input a BIM model and/or project into apparatus 500. Inputting may include inputting by selecting an add-on of an existing design software, uploading a BIM model to a standalone software, and/or a computing device recognizing a BIM model/project within a design software and receiving the BIM model. At step 508, apparatus 500 may receive data from the user's BIM model and/or project. Apparatus may receive data in any way described within this disclosure. At step 512, apparatus 500 may predict and/or classify a user's design problems using a first machine learning model as described above. At step 516 apparatus may generate design solutions using a second machine learning model. In some cases, apparatus may populate an interactive diagram based on the design problems. At step 520, Apparatus 500 may generate and/or display an interactive diagram in which a user may interact with the classified objects. In some cases, the diagram may serve as a communication channel between apparatus and a user. In some cases, apparatus 500 may generate a vector-based interactive design diagram in real time based on the classified design problem. In some cases, at step 524, apparatus 500 apparatus may receive design guidance from a database and at step 528, apparatus 500 may display design guidance. For example, a user may select a portion of a displayed element wherein apparatus 500 may display related design guidance similar to the selected portion. Design guidance may be a text description and/or combinations of images, diagrams, and text.

With continued reference to FIG. 5, a user may interact with the interactive display displayed at step 520. At step 532, a user may explore products on apparatus 500. Apparatus 500 may display products only relevant based on user interaction and/or selection. For example, when a user clicks a portion of a displayed element, apparatus 500 may only display components and/or products similar to the selected portion. A user may navigate through a variety of options as described in FIGS. 1-4, wherein a user may select similar components and/or products based on the selected portion. In some cases, a user may navigate components based on predefined parameters. At step 536, a user may employ a 'smart product search' wherein a user may navigate through displayed components and/or products by sorting the components and/or products to meet the user's requirements and/or preferences. A user may set parameters with various weights wherein a computing device communicatively connected to apparatus 500 may sort components based on the preferences and their corresponding weights. For example, a user may set a preference of 'affordability' with a weight of 3, a preference of 'availability' with a weight of 3, and a preference of price with a weight of 2. Apparatus 500 may sort a list of components to conform to the user's preferences and/or requirements using a multi-objective optimization model. In some cases, a building product database may provide the components to a user. At step 540, apparatus 500 may receive components and/or products from a building product database. In some cases, apparatus 500 may receive products from a building product database, wherein the products may be sorted, at step 544 using a multi-objective optimization model to sort the products based on a user's requirements. In some cases, user may interact with the multi objective optimization model such as, for example, by interacting with a user interface to input and/or select requirements, setting a weight of a particular requirement using a sliding bar configured to weight and the like. In some cases, at step 548, apparatus 500 may employ a 'smart product comparison' wherein products are shown as a function of the requirements in step 536. In some cases, a user may view the components and/or products visually such as in a visual format. In some cases, a product may be shown along with its corresponding weights. In some cases, each product may be viewed side by side with another product. In some cases, a list of products may be displayed wherein a first product having a higher degree of match with a user's preference may be shown first. In some cases, at step 552, apparatus may display product specifications that are associated with a particular product. Apparatus 500 may enable a fully integrated specification feature, wherein a user may view the specification of a particular product without having to use a 3rd party software to lookup details about a particular component. In some cases, at step 556, a user may select a particular product wherein apparatus 500 may integrate the particular product into the BIM model that had been inputted by a user in step 104. Users may click and place a component into their BIM model. These BIM components may be provided by manufacturers. In some cases, users may be able to specify products as a basis of design and use their BIM component directly from apparatus 500. In some cases, this may eliminate any cumbersome process of finding a particular and/or correct BIM component using an online search.

With continued reference to FIG. 5, at step 560, a user may instead input a design image, rather than a BIM model as specified in step 504. The design image can be a rendered image of a project or any reference image that the user has. At step 562, apparatus 500 may receive the design image. The design image may be received via an add-on as described in this disclosure wherein apparatus 500 may be used in conjunction with a 3rd party design software and receive design image form the 3rd party software. At step 568, apparatus 500 may predict physical and optical parameters (POP) of design image wherein the physical and optical parameters may include camera parameters of each pixel, 3d depth of each pixel, light condition of each pixel and the like. At step 572, apparatus may segment the design image onto more than one building part, wherein each building part may represent a separate component of an overall model within design image. For example, apparatus 500 may segment the design image into multiple building parts such as a black matter exterior wall panel, a gray glossy interior painted wall, a window, a door, and the like. At step 576, a user may select one segment of the design image representing a building part wherein a user may view products similar to the selected part. For example, a user may select an exterior wall, wherein a user may view similar building parts corresponding to an exterior wall. At step 580, apparatus may use classification of the selected region to provide products for a user to explore similar to steps 532, 536, 548, 552 and/or 556 as described above, a user, may select parameters of a particular product using a 'smart product search' wherein a user may view products similar to the selected product. At step 584, a user may select a particular product to explore further. At step 586, apparatus 500 may further determine physical and optical parameters of the selected image. Apparatus 500 may determine physical and optical parameters using a machine learning model such as a machine learning model as described in this disclosure. At step 588, apparatus 500 may use a fourth machine learning model to segment the selected product and acquire only a relevant region as a style reference. At step 190, apparatus may use a fifth machine learning model in order to transfer the style of the selected region of the design image on the acquired product style reference. Using the physical and optical parameters of both the design image and the selected product image, apparatus 500 may match the style reference's physical and optical parameters to the design image. At step 592, apparatus 500 may display an updated image that near-perfectly mapped product texture with correct scale, light and perspective. At step 594, apparatus may display similar or relevant products based on the selected product. Similar products may be based on aesthetic similarity, visual similarity, performance similarity and the like. At step 596, a user may select another product to explore wherein apparatus may receive the selected product similar to step 584 and perform determinations based on the selected product. In some cases, following step 592, at step 598 a user may specify the chosen product from step 584 as the basis for their design. AS a result apparatus may receive product specification as indicated in step 552 and allow a user to drack and drop the product as indicated in step 556.

Figure 6:
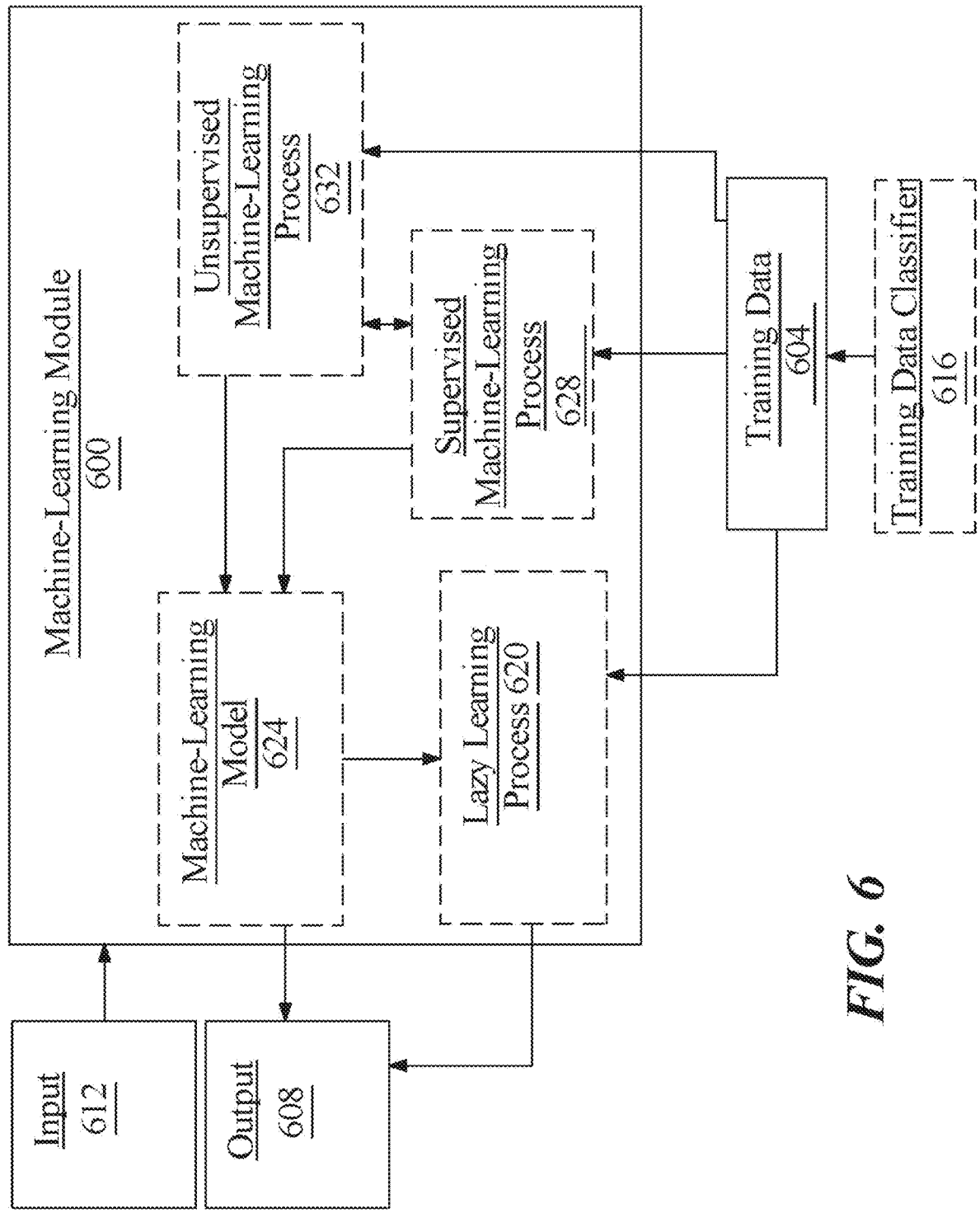
FIG. 6 is a diagram of an exemplary embodiment of a machine-learning module.

Referring now to FIG. 6, an exemplary embodiment of a machine-learning module 600 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 604 to generate an algorithm that will be performed by a computing device/module to produce outputs 608 given data provided as inputs 612; this is in contrast to a non-machine learning software program where the commands to be executed are determined in advance by a user and written in a programming language.

Still referring to FIG. 6, "training data," as used herein, is data containing correlations that a machine-learning process may use to model relationships between two or more categories of data elements. For instance, and without limitation, training data 604 may include a plurality of data entries, each entry representing a set of data elements that were recorded, received, and/or generated together; data elements may be correlated by shared existence in a given data entry, by proximity in a given data entry, or the like. Multiple data entries in training data 604 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 604 according to various correlations; correlations may indicate causative and/or predictive links between categories of data elements, which may be modeled as relationships such as mathematical relationships by machine-learning processes as described in further detail below. Training data 604 may be formatted and/or organized by categories of data elements, for instance by associating data elements with one or more descriptors corresponding to categories of data elements. As a non-limiting example, training data 604 may include data entered in standardized forms by persons or processes, such that entry of a given data element in a given field in a form may be mapped to one or more descriptors of categories. Elements in training data 604 may be linked to descriptors of categories by tags, tokens, or other data elements; for instance, and without limitation, training data 604 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 6, training data 604 may include one or more elements that are not categorized; that is, training data 604 may not be formatted or contain descriptors for some elements of data. Machine-learning algorithms and/or other processes may sort training data 604 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 604 to be made applicable for two or more distinct machine-learning algorithms as described in further detail below. Training data 604 used by machine-learning module 600 may correlate any input data as described in this disclosure to any output data as described in this disclosure.

Further referring to FIG. 6, training data may be filtered, sorted, and/or selected using one or more supervised and/or unsupervised machine-learning processes and/or models as described in further detail below; such models may include without limitation a training data classifier 616. Training data classifier 616 may include a "classifier," which as used in this disclosure is a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Machine-learning module 600 may generate a classifier using a classification algorithm, defined as a process whereby a computing device and/or any module and/or component operating thereon derives a classifier from training data 604. Classification may be performed using, without limitation, linear classifiers such as without limitation logistic regression and/or naive Bayes classifiers, nearest neighbor classifiers such as k-nearest neighbors' classifiers, support vector machines, least squares support vector machines, fisher's linear discriminant, quadratic classifiers, decision trees, boosted trees, random forest classifiers, learning vector quantization, and/or neural network-based classifiers.

Still referring to FIG. 6, machine-learning module 600 may be configured to perform a lazy-learning process 620 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 604. Heuristic may include selecting some number of highest-ranking associations and/or training data 604 elements. Lazy learning may implement any suitable lazy learning algorithm, including without limitation a K-nearest neighbors algorithm, a lazy naive Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 6, machine-learning processes as described in this disclosure may be used to generate machine-learning models 624. A "machine-learning model," as used in this disclosure, is a mathematical and/or algorithmic representation of a relationship between inputs and outputs, as generated using any machine-learning process including without limitation any process as described above, and stored in memory; an input is submitted to a machine-learning model 624 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 624 may be generated by creating an artificial neural network, such as a convolutional neural network comprising an input layer of nodes, one or more intermediate layers, and an output layer of nodes. Connections between nodes may be created via the process of "training" the network, in which elements from a training data 604 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 6, machine-learning algorithms may include at least a supervised machine-learning process 628. At least a supervised machine-learning process 628, as defined herein, include algorithms that receive a training set relating a number of inputs to a number of outputs, and seek to find one or more mathematical relations relating inputs to outputs, where each of the one or more mathematical relations is optimal according to some criterion specified to the algorithm using some scoring function. For instance, a supervised learning algorithm may include inputs and outputs as described above in this disclosure, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 604. Persons skilled in the art, upon reviewing the entirety of this disclosure, will be aware of various possible variations of at least a supervised machine-learning process 628 that may be used to determine relation between inputs and outputs. Supervised machine-learning processes may include classification algorithms as defined above.

Further referring to FIG. 6, machine learning processes may include at least an unsupervised machine-learning processes 632. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 6, machine-learning module 600 may be designed and configured to create a machine-learning model 624 using techniques for development of linear regression models. Linear regression models may include ordinary least squares regression, which aims to minimize the square of the difference between predicted outcomes and actual outcomes according to an appropriate norm for measuring such a difference (e.g., a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 6, machine-learning algorithms may include, without limitation, linear discriminant analysis. Machine-learning algorithm may include quadratic discriminate analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors' algorithms. Machine-learning algorithms may include various forms of latent space regularization such as variational regularization. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized tress, AdaBoost, gradient tree boosting, and/or voting classifier methods. Machine-learning algorithms may include neural net algorithms, including convolutional neural net processes.

Figure 7:
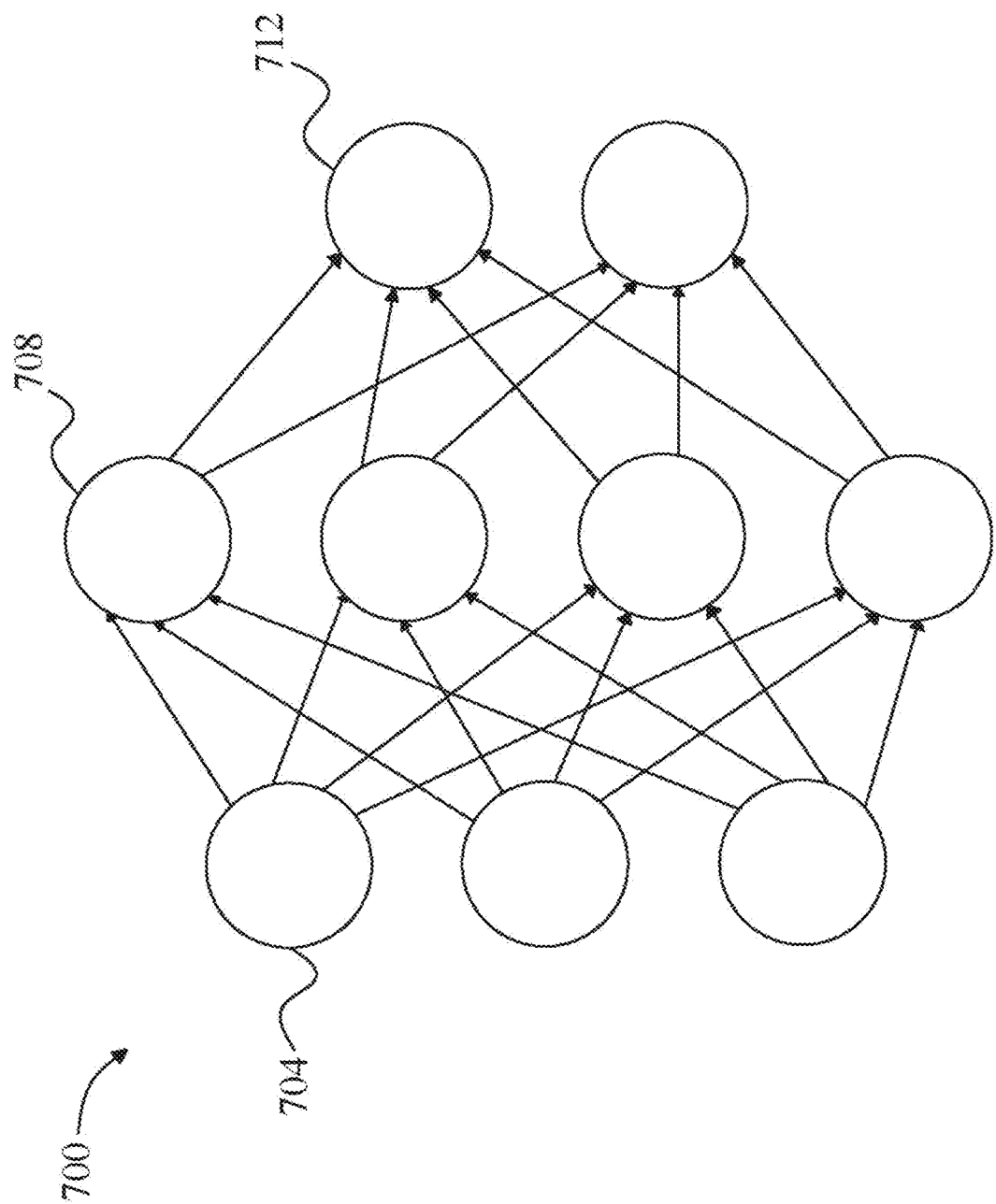
FIG. 7 is a diagram of an exemplary embodiment of a neural network.

Referring now to FIG. 7, an exemplary embodiment of neural network 700 is illustrated. A neural network 700 also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes 704, one or more intermediate layers 708, and an output layer of nodes 712. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning. Connections may run solely from input nodes toward output nodes in a "feed-forward" network or may feed outputs of one layer back to inputs of the same or a different layer in a "recurrent network." As a further non-limiting example, a neural network may include a convolutional neural network comprising an input layer of nodes, one or more intermediate layers, and an output layer of nodes. A "convolutional neural network," as used in this disclosure, is a neural network in which at least one hidden layer is a convolutional layer that convolves inputs to that layer with a subset of inputs known as a "kernel," along with one or more additional layers such as pooling layers, fully connected layers, and the like.

Figure 8:
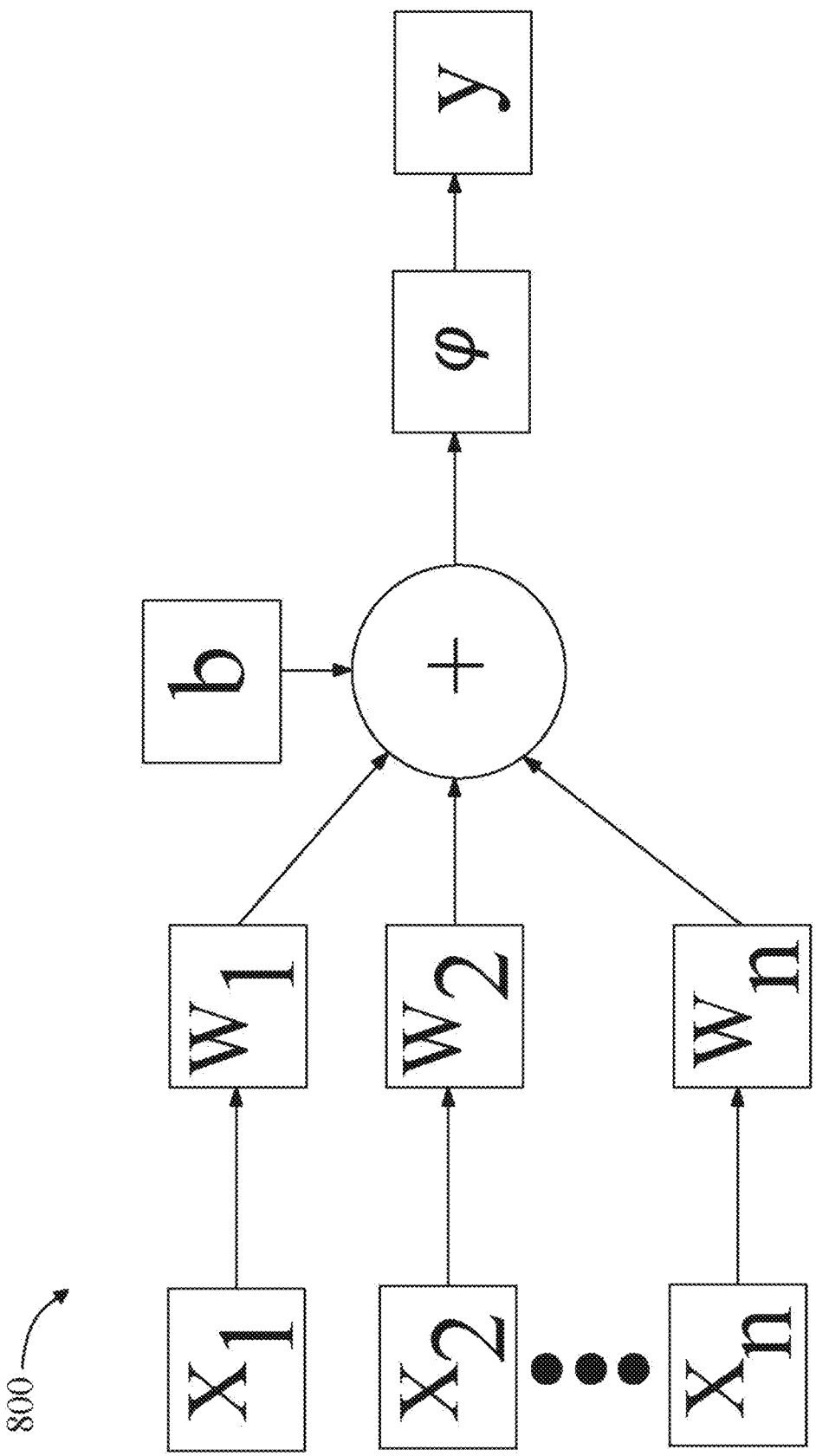
FIG. 8 is a diagram of an exemplary embodiment of a node of a neural network.

Referring now to FIG. 8, an exemplary embodiment 800 of a node of a neural network is illustrated. A node may include, without limitation a plurality of inputs $x_i$ that may receive numerical values from inputs to a neural network containing the node and/or from other nodes. Node may perform a weighted sum of inputs using weights $w_i$ that are multiplied by respective inputs $x_i$. Additionally or alternatively, a bias b may be added to the weighted sum of the inputs such that an offset is added to each unit in the neural network layer that is independent of the input to the layer. The weighted sum may then be input into a function φ, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above.

Figure 9:
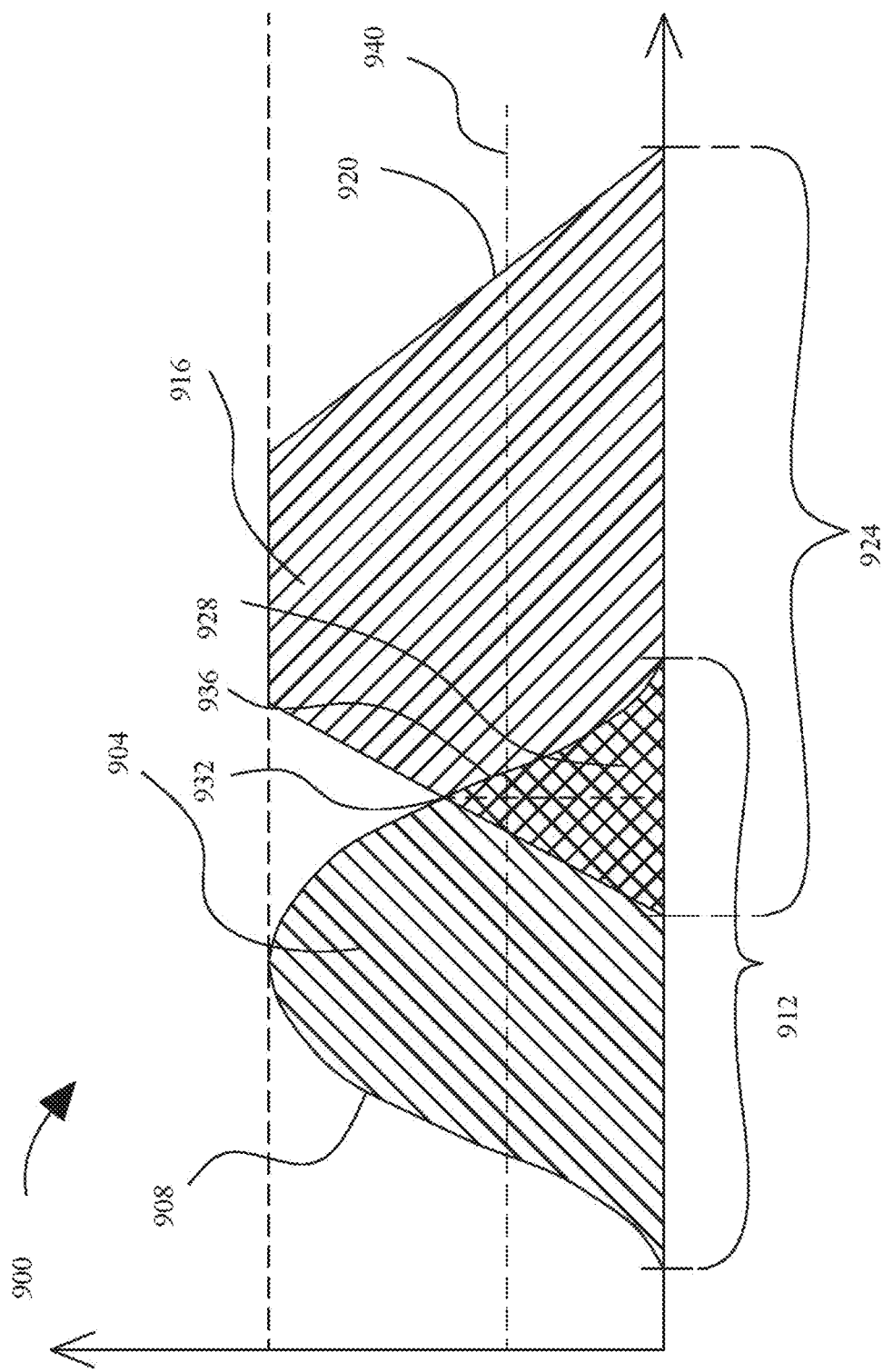
FIG. 9 is a diagram of an exemplary embodiment of a fuzzy set comparison.

Referring to FIG. 9, an exemplary embodiment of fuzzy set comparison 900 is illustrated. A first fuzzy set 904 may be represented, without limitation, according to a first membership function 908 representing a probability that an input falling on a first range of values 912 is a member of the first fuzzy set 904, where the first membership function 908 has values on a range of probabilities such as without limitation the interval [0,1], and an area beneath the first membership function 908 may represent a set of values within first fuzzy set 904. Although first range of values 912 is illustrated for clarity in this exemplary depiction as a range on a single number line or axis, first range of values 912 may be defined on two or more dimensions, representing, for instance, a Cartesian product between a plurality of ranges, curves, axes, spaces, dimensions, or the like. First membership function 908 may include any suitable function mapping first range 912 to a probability interval, including without limitation a triangular function defined by two linear elements such as line segments or planes that intersect at or below the top of the probability interval. As a non-limiting example, triangular membership function may be defined as:

$$y(x, a, b, c) = \begin{cases} 0, \text{ for } x > c \text{ and } x < a \\ \frac{x-a}{b-a}, \text{ for } a \le x < b \\ \frac{c-x}{c-b}, \text{ if } b < x \le c \end{cases}$$

a trapezoidal membership function may be defined as:

$$y(x, a, b, c, d) = \max\left(\min\left(\frac{x-a}{b-a}, 1, \frac{d-x}{d-c}\right), 0\right)$$

a sigmoidal function may be defined as:

$$y(x, a, c) = \frac{1}{1 - e^{-a(x-c)}}$$

a Gaussian membership function may be defined as:

$$y(x, c, \sigma) = e^{-\frac{1}{2}(\frac{x-c}{\sigma})^2}$$

and a bell membership function may be defined as:

$$y(x, a, b, c,) = \left[1 + \left|\frac{x-c}{a}\right|^{2b}\right]^{-1}$$

Persons skilled in the art, upon reviewing the entirety of this disclosure, will be aware of various alternative or additional membership functions that may be used consistently with this disclosure.

Still referring to FIG. 9, first fuzzy set 904 may represent any value or combination of values as described above, including output from one or more machine-learning models. A second fuzzy set 916, which may represent any value which may be represented by first fuzzy set 904, may be defined by a second membership function 920 on a second range 924; second range 924 may be identical and/or overlap with first range 912 and/or may be combined with first range via Cartesian product or the like to generate a mapping permitting evaluation overlap of first fuzzy set 904 and second fuzzy set 916. Where first fuzzy set 904 and second fuzzy set 916 have a region 928 that overlaps, first membership function 908 and second membership function 920 may intersect at a point 932 representing a probability, as defined on probability interval, of a match between first fuzzy set 904 and second fuzzy set 916. Alternatively or additionally, a single value of first and/or second fuzzy set may be located at a locus 936 on first range 912 and/or second range 924, where a probability of membership may be taken by evaluation of first membership function 908 and/or second membership function 920 at that range point.

A probability at 928 and/or 932 may be compared to a threshold 940 to determine whether a positive match is indicated. Threshold 940 may, in a non-limiting example, represent a degree of match between first fuzzy set 904 and second fuzzy set 916, and/or single values therein with each other or with either set, which is sufficient for purposes of the matching process; for instance, threshold may indicate a sufficient degree of overlap between an output from one or more machine-learning models and/or design problem 124 and a predetermined class, for combination to occur as described above. Alternatively or additionally, each threshold may be tuned by a machine-learning and/or statistical process, for instance and without limitation as described in further detail below.

Further referring to FIG. 9, in an embodiment, a degree of match between fuzzy sets may be used to classify a design problem 124 based on input data such as the representative part model 112. For instance, if a design problem has a fuzzy set matching a representative part model fuzzy set by having a degree of overlap exceeding a threshold, processor 104 may classify the design problem 124 as belonging to the representative part model. Where multiple fuzzy matches are performed, degrees of match for each respective fuzzy set may be computed and aggregated through, for instance, addition, averaging, or the like, to determine an overall degree of match.

Still referring to FIG. 9, in an embodiment, a design problem may be compared to multiple representative part model fuzzy sets. For instance, design problem may be represented by a fuzzy set that is compared to each of the multiple representative part model fuzzy sets; and a degree of overlap exceeding a threshold between the design problem fuzzy set and any of the multiple representative part model fuzzy sets may cause processor 104 to classify the design problem as belonging to representative part model. For instance, in one embodiment there may be two representative part model fuzzy sets, representing respectively representative part model and representative part model. First representative part model may have a first fuzzy set; Second representative part model may have a second fuzzy set; and design problem may have a design problem fuzzy set. Processor 104, for example, may compare a design problem fuzzy set with each of representative part model fuzzy set and representative part model fuzzy set, as described above, and classify a design problem to either, both, or neither of representative part model or representative part model. Machine-learning methods as described throughout may, in a non-limiting example, generate coefficients used in fuzzy set equations as described above, such as without limitation x, c, and σ of a Gaussian set as described above, as outputs of machine-learning methods. Likewise, design problem may be used indirectly to determine a fuzzy set, as design problem fuzzy set may be derived from outputs of one or more machine-learning models that take the design problem directly or indirectly as inputs.

Still referring to FIG. 9, a computing device may use a logic comparison program, such as, but not limited to, a fuzzy logic model to determine a score. A score may include, but is not limited to, amateur, average, knowledgeable, superior, and the like; each such score may be represented as a value for a linguistic variable representing score, or in other words a fuzzy set as described above that corresponds to a degree of similarity as calculated using any statistical, machine-learning, or other method that may occur to a person skilled in the art upon reviewing the entirety of this disclosure. In other words, a given element of design problem may have a first non-zero value for membership in a first linguistic variable value and a second non-zero value for membership in a second linguistic variable value. In some embodiments, determining a score may include using a linear regression model. A linear regression model may include a machine learning model. A linear regression model may be configured to map data of design problem, such as various elements in the representative part model, to one or more scores. A linear regression model may be trained using previously categorized elements in the representative part model. In some embodiments, determining a score of design problem may include using a score classification model. A score classification model may be configured to input collected data and cluster data to a centroid based on, but not limited to, frequency of appearance, and the like. Centroids may include scores assigned to them such that elements of the representative part model may each be assigned a score. In some embodiments, and score classification model may include a K-means clustering model. In some embodiments, and score classification model may include a particle swarm optimization model. In some embodiments, determining a score of design problem may include using a fuzzy inference engine. A fuzzy inference engine may be configured to map one or more design problem data elements using fuzzy logic. In some embodiments, a plurality of entity assessment devices may be arranged by a logic comparison program into score arrangements. An "score arrangement" as used in this disclosure is any grouping of objects and/or data based on skill level and/or output score. This step may be implemented as described above in FIGS. 1-7. Membership function coefficients and/or constants as described above may be tuned according to classification and/or clustering algorithms. For instance, and without limitation, a clustering algorithm may determine a Gaussian or other distribution of questions about a centroid corresponding to a given score level, and an iterative or other method may be used to find a membership function, for any membership function type as described above, that minimizes an average error from the statistically determined distribution, such that, for instance, a triangular or Gaussian membership function about a centroid representing a center of the distribution that most closely matches the distribution. Error functions to be minimized, and/or methods of minimization, may be performed without limitation according to any error function and/or error function minimization process and/or method as described in this disclosure.

Further referring to FIG. 9, an inference engine may be implemented according to input and/or output membership functions and/or linguistic variables. For instance, a first linguistic variable may represent a first measurable value pertaining to a degree of similarity, while a second membership function may indicate a degree of similarity of a subject thereof, or another measurable value pertaining to design problem. Continuing the example, an output linguistic variable may represent, without limitation, a score value. An inference engine may combine rules, such as: "if the difficulty level is 'hard' and the popularity level is 'high', the question score is 'high'"—the degree to which a given input function membership matches a given rule may be determined by a triangular norm or "T-norm" of the rule or output membership function with the input membership function, such as min (a, b), product of a and b, drastic product of a and b, Hamacher product of a and b, or the like, satisfying the rules of commutativity ($T(a, b)=T(b, a)$), monotonicity: ($T(a, b) \leq T(c, d)$ if $a \leq c$ and $b \leq d$), (associativity: $T(a, T(b, c))=T(T(a, b), c)$), and the requirement that the number 1 acts as an identity element. Combinations of rules ("and" or "or" combination of rule membership determinations) may be performed using any T-conorm, as represented by an inverted T symbol or "$\perp$," such as max(a, b), probabilistic sum of a and b (a+b−a*b), bounded sum, and/or drastic T-conorm; any T-conorm may be used that satisfies the properties of commutativity: $\perp(a, b)=\perp(b, a)$, monotonicity: $\perp(a, b) \leq \perp(c, d)$ if $a \leq c$ and $b \leq d$, associativity: $\perp(a, \perp(b, c))=\perp(\perp(a, b), c)$, and identity element of 0. Alternatively or additionally T-conorm may be approximated by sum, as in a "product-sum" inference engine in which T-norm is product and T-conorm is sum. A final output score or other fuzzy inference output may be determined from an output membership function as described above using any suitable defuzzification process, including without limitation Mean of Max defuzzification, Centroid of Area/Center of Gravity defuzzification, Center Average defuzzification, Bisector of Area defuzzification, or the like. Alternatively or additionally, output rules may be replaced with functions according to the Takagi-Sugeno-King (TSK) fuzzy model.

Further referring to FIG. 9, design problem to be used may be selected by user selection, and/or by selection of a distribution of output scores, such as 30% hard/expert, 40% moderate average, and 30% easy/beginner levels or the like.

Figure 10:
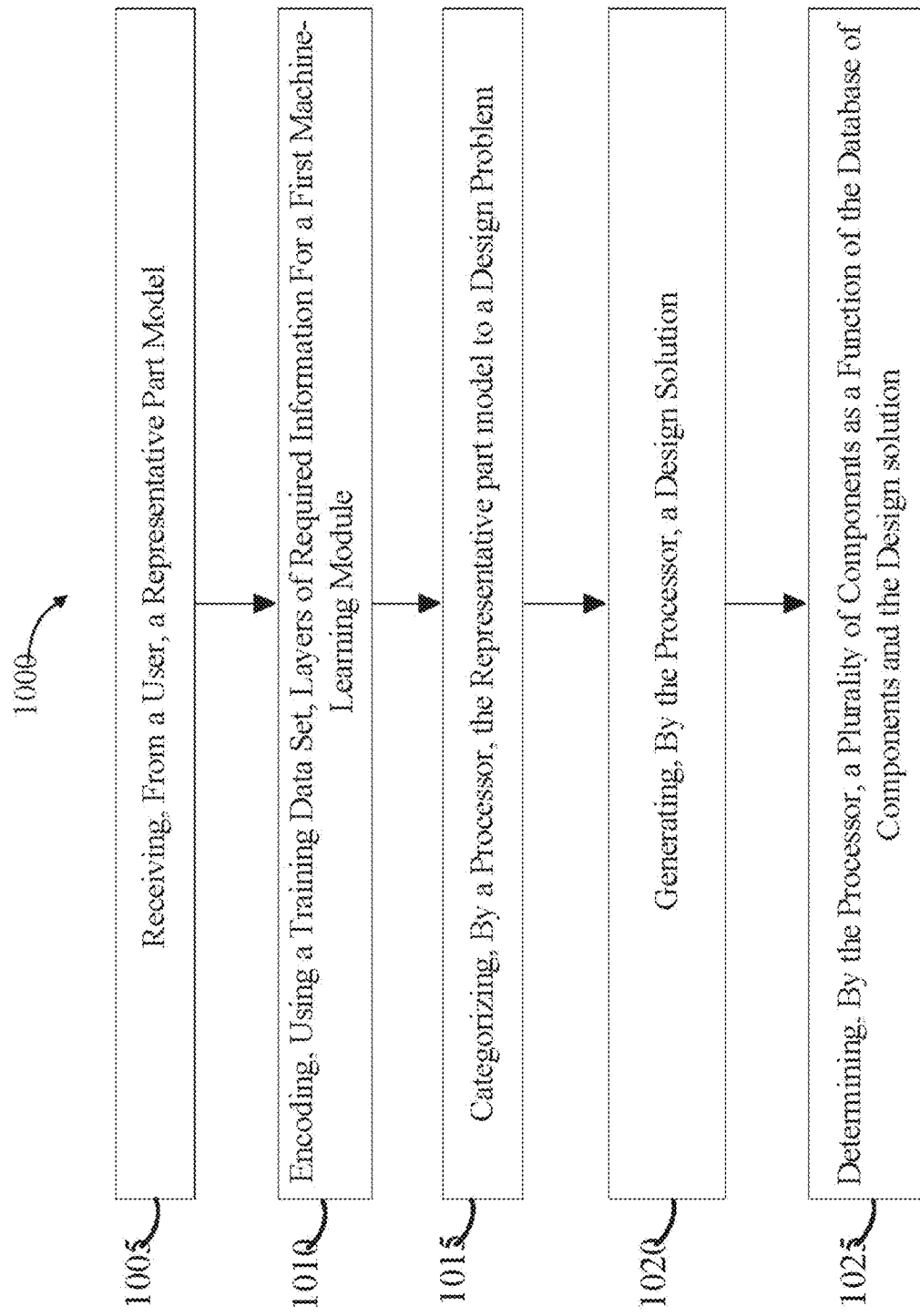
FIG. 10 is a is a flow diagram illustrating an exemplary embodiment of a method for determining and solving design problems using machine learning.

Referring now to FIG. 10, a method 1000 for determining and solving design problems using machine learning is described. At step 1005, method 1000 includes receiving, from a user, a representative part model wherein the representative part model includes a computer model of a building design. In some cases, the representative part model includes a print of the building design. This step may be implemented as described above with reference to FIGS. 1-9, without limitation.

With continued reference to FIG. 10, at step 1010, method 1000 includes encoding, using a training data set, layers of required information for a first machine-learning module. This step may be implemented as described above with reference to FIGS. 1-8, without limitation.

With continued reference to FIG. 10, at step 1015, method 1000 includes categorizing, by a processor, representative part model to a design problem using a first machine-learning module, as a function of the representative part model. In some cases, the second machine learning module includes a generative adversarial network. This step may be implemented as described above with reference to FIGS. 1-8, without limitation.

With continued reference to FIG. 10, at step 1020, method 1000 includes generating, by the processor, a design solution, in a visual format, using a second machine-learning module as a function of the design problem. In some cases, the design solution includes more than one solution. In some cases, each solution within the design solution is associated with a problem within the design problem. This step may be implemented as described above with reference to FIGS. 1-8, without limitation.

With continued reference to FIG. 10, at step 1025, method 1000 includes determining, by the processor, a plurality of components as a function of the database of components and the design solution. In some cases, the method further includes producing, by the processor, at least one building information modeling (BIM) integrated object as a function of the plurality of components, wherein the BIM integrated object is visual representation of a component. In some cases, the method further includes generating, by the processor, a modified part model as a function of the plurality of components. In some cases, generating, by the processor, the modified part model as a function of the plurality of components may include generating the modified part model as a function of user input.

With continued reference to FIG. 10, method 1000 may further include creating, by the processor, a user interface data structure including the plurality of components and transmitting, by the processor, the user interface data structure. In some cases transmitting, by the processor, may further include transmitting, by the processor, the user interface data structure to a graphical user interface (GUI), wherein the GUI is configured to receive the user interface data structure and display the plurality of components as a function of the user interface data structure.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 11:
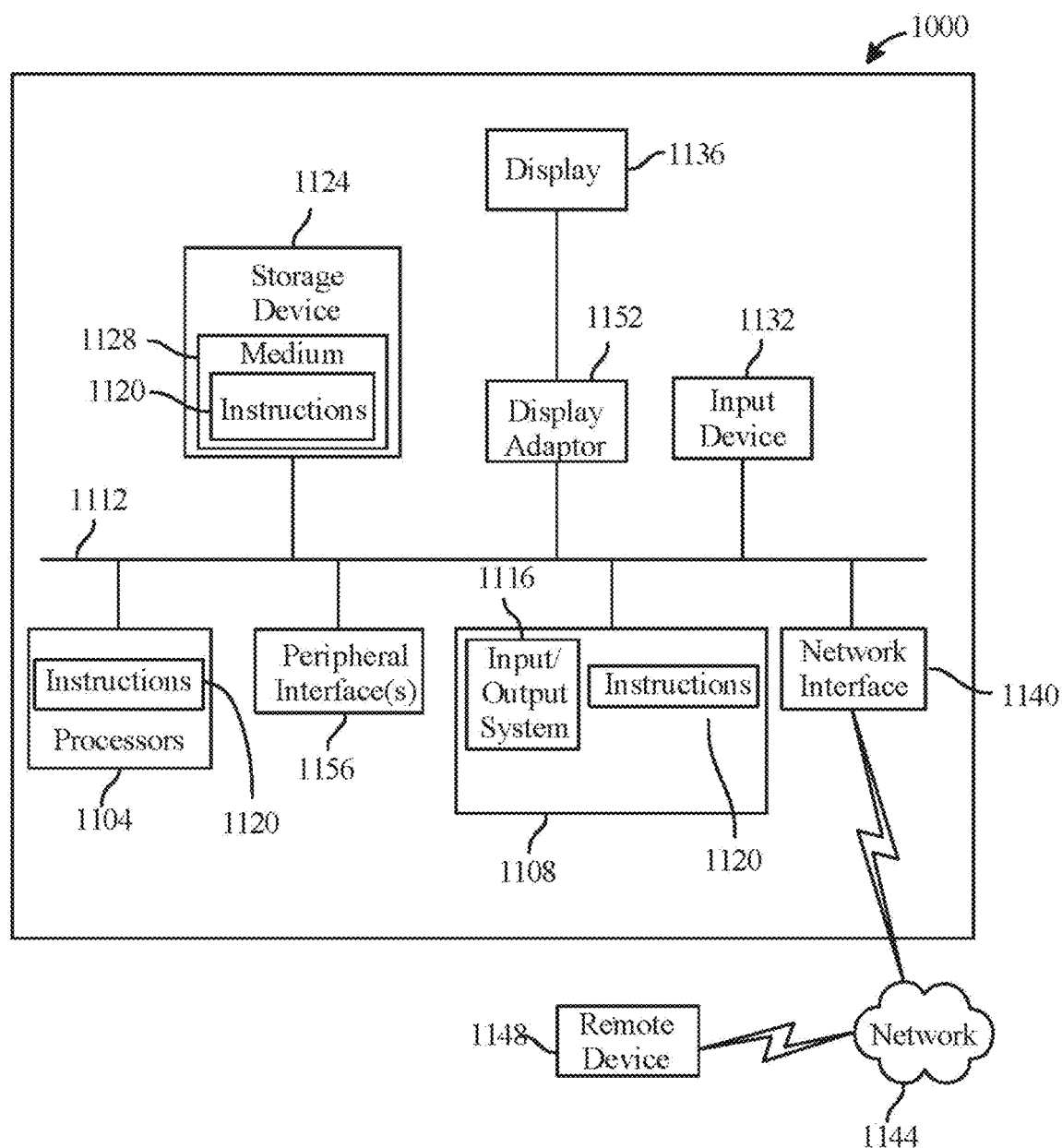
FIG. 11 is a block diagram of a computing system that can be used to implement any one or more of the methodologies disclosed herein and any one or more portions thereof.

FIG. 11 shows a diagrammatic representation of one embodiment of a computing device in the exemplary form of a computer system 1100 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 1100 includes a processor 1104 and a memory 1108 that communicate with each other, and with other components, via a bus 1112. Bus 1112 may include any of several types of bus structures including, but not limited to, a memory bus, a memory controller, a peripheral bus, a local bus, and any combinations thereof, using any of a variety of bus architectures.

Processor 1104 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 1104 may be organized according to Von Neumann and/or Harvard architecture as a non-limiting example. Processor 1104 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC)

Memory 1108 may include various components (e.g., machine-readable media) including, but not limited to, a random-access memory component, a read only component, and any combinations thereof. In one example, a basic input/output system 1116 (BIOS), including basic routines that help to transfer information between elements within computer system 1100, such as during start-up, may be stored in memory 1108. Memory 1108 may also include (e.g., stored on one or more machine-readable media) instructions (e.g., software) 1120 embodying any one or more of the aspects and/or methodologies of the present disclosure. In another example, memory 1108 may further include any number of program modules including, but not limited to, an operating system, one or more application programs, other program modules, program data, and any combinations thereof.

Computer system 1100 may also include a storage device 1124. Examples of a storage device (e.g., storage device 1124) include, but are not limited to, a hard disk drive, a magnetic disk drive, an optical disc drive in combination with an optical medium, a solid-state memory device, and any combinations thereof. Storage device 1124 may be connected to bus 1112 by an appropriate interface (not shown). Example interfaces include, but are not limited to, SCSI, advanced technology attachment (ATA), serial ATA, universal serial bus (USB), IEEE 13114 (FIREWIRE), and any combinations thereof. In one example, storage device 1124 (or one or more components thereof) may be removably interfaced with computer system 1100 (e.g., via an external port connector (not shown)). Particularly, storage device 1124 and an associated machine-readable medium 1128 may provide nonvolatile and/or volatile storage of machine-readable instructions, data structures, program modules, and/or other data for computer system 1100. In one example, software 1120 may reside, completely or partially, within machine-readable medium 1128. In another example, software 1120 may reside, completely or partially, within processor 1104.

Computer system 1100 may also include an input device 1132. In one example, a user of computer system 1100 may enter commands and/or other information into computer system 1100 via input device 1132. Examples of an input device 1132 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 1132 may be interfaced to bus 1112 via any of a variety of interfaces (not shown) including, but not limited to, a serial interface, a parallel interface, a game port, a USB interface, a FIRE-WIRE interface, a direct interface to bus 1112, and any combinations thereof. Input device 1132 may include a touch screen interface that may be a part of or separate from display 1136, discussed further below. Input device 1132 may be utilized as a user selection device for selecting one or more graphical representations in a graphical interface as described above.

A user may also input commands and/or other information to computer system 1100 via storage device 1124 (e.g., a removable disk drive, a flash drive, etc.) and/or network interface device 1140. A network interface device, such as network interface device 1140, may be utilized for connecting computer system 1100 to one or more of a variety of networks, such as network 1144, and one or more remote devices 1148 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 1144, may employ a wired and/or a wireless mode of communication. In general, any network topology may be used. Information (e.g., data, software 1120, etc.) may be communicated to and/or from computer system 1100 via network interface device 1140.

Computer system 1100 may further include a video display adapter 1152 for communicating a displayable image to a display device, such as display device 1136. Examples of a display device include, but are not limited to, a liquid crystal display (LCD), a cathode ray tube (CRT), a plasma display, a light emitting diode (LED) display, and any combinations thereof. Display adapter 1152 and display device 1136 may be utilized in combination with processor 1104 to provide graphical representations of aspects of the present disclosure. In addition to a display device, computer system 1100 may include one or more other peripheral output devices including, but not limited to, an audio speaker, a printer, and any combinations thereof. Such peripheral output devices may be connected to bus 1112 via a peripheral interface 1156. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An apparatus for determining and solving design problems using machine learning, the apparatus comprising:
    a database of components from a plurality of manufacturers;
    at least a processor; and
    a memory communicatively connected to the processor, the memory containing instructions configuring the at least a processor to:
        receive a representative part model, wherein the representative part model comprises a computer model of a building design;
        encode, using a training data set, layers of required information for a first machine-learning module;
        categorize the representative part model to a design problem using the first machine-learning module;
        generate a design solution, in a visual format, using a second machine-learning module, as a function of the design problem;
        classify the representative part model into one or more region classes;
        segment the representative part model into one or more building parts as a function of the classification;
        determine a plurality of components as a function of the database of components, the design solution, and a user input, wherein determining the plurality components comprises filtering the plurality of components as a function of at least one user input parameter and a parameter weight of each of the at least one user input parameter;
        display at least one building part of the one or more building parts and one corresponding component of the plurality of components through a graphical user interface as a function of a user selection of the segmented representative part model; and
        generate a product information sheet as a function of the plurality of components, wherein the product information sheet comprises information regarding a manufacturing time for the plurality of components.

2. The apparatus of claim 1, wherein the representative part model comprises a print of the building design.

3. The apparatus of claim 1, wherein the second machine learning module comprises a generative adversarial network.

4. The apparatus of claim 1, wherein the memory further contains instructions configuring the at least a processor to:
create a user interface data structure comprising the plurality of components; and
transmit the user interface data structure.

5. The apparatus of claim 4, wherein the graphical user interface (GUI) is communicatively connected to the at least a processor, the GUI configured to:
receive the user interface data structure; and
display the plurality of components as a function of the user interface data structure.

6. The apparatus of claim 1, wherein each solution within the design solution is associated with a problem within the design problem.

7. The apparatus of claim 5, wherein the memory further contains instructions configuring the processor to generate a modified part model as a function of the plurality of components.

8. The apparatus of claim 7, wherein generating the modified part model as a function of the plurality of components comprises generating the modified part model as a function of a second user input.

9. The apparatus of claim 1, wherein the memory further contains instructions configuring the processor to produce at least one building information modeling (BIM) integrated object as a function of the plurality of components, wherein the BIM integrated object comprises a visual representation of a component.

10. The apparatus of claim 1, wherein:
The apparatus further comprises a graphical user interface comprising a collaboration feature, wherein the collaboration feature allows for multiple inputs from multiple differing users for the representative part model; and
determining the plurality of components as a function of the database of components, the design solution, and the user input comprises determining the plurality of components as a function of the database of components, the design solution, and the user input from more than one users through the collaboration feature on the graphical user interface.

11. A method for determining and solving design problems using machine learning, the method comprising:
receiving, from a user, a representative part model wherein the representative part model comprises a computer model of a building design;
encoding, using a training data set, layers of required information for a first machine-learning module;
categorizing, by a processor, the representative part model to a design problem using a first machine-learning module;
generating, by the processor, a design solution, in a visual format, using a second machine-learning module as a function of the design problem;
classifying, by the processor, the representative part model into one or more region classes;
segmenting, by the processor, the representative part model into one or more building parts as a function of the classification;
determining, by the processor, a plurality of components as a function of a database of components from a plurality of manufacturers, the design solution, and a user input, wherein determining the plurality components comprises filtering the plurality of components as a function of at least one user input parameter and a parameter weight of each of the at least one user input parameter from the user input;
displaying, by the processor, at least one building part of the one or more building parts and one corresponding component of the plurality of components through a graphical user interface as a function of a user selection of the segmented representative part model; and
generating, by the processor, a product information sheet as a function of the plurality of components, wherein the product information sheet comprises information regarding a manufacturing time for the plurality of components.

12. The method of claim 11, wherein the representative part model comprises a print of the building design.

13. The method of claim 11, wherein the second machine learning module comprises a generative adversarial network.

14. The method of claim 11, further comprising:
creating, by the processor, a user interface data structure comprising the plurality of components.

15. The method of claim 14, further comprising:
transmitting, by the processor, the user interface data structure to the graphical user interface (GUI), wherein the GUI is configured to display the plurality of components as a function of the user interface data structure.

16. The method of claim 11, wherein each solution within design solution is associated with a problem within the design problem.

17. The method of claim 15, further comprising generating, by the processor, a modified part model as a function of the plurality of components.

18. The method of claim 17, wherein generating, by the processor, the modified part model as a function of the plurality of components comprises generating, by the processor, the modified part model as a function of a second user input.

19. The method of claim 11, further comprising producing, by the at least a processor, at least one building information modeling (BIM) integrated object as a function of the plurality of components, wherein the BIM integrated object is visual representation of a component.

20. The method of claim 11, wherein determining, by the processor, the plurality of components as a function of the database of components, the design solution, and the user input comprises determining, by the processor, the plurality of components as a function of the database of components, the design solution, and the user input from more than one users through a collaboration feature on a graphical user interface, wherein the wherein the collaboration feature allows for multiple inputs from multiple differing users for the representative part model.

* * * * *